United States Patent
Park et al.

(10) Patent No.: US 12,080,230 B2
(45) Date of Patent: Sep. 3, 2024

(54) DISPLAY PANEL

(71) Applicant: Samsung Display Co., Ltd., Yongin-si (KR)

(72) Inventors: Juchan Park, Yongin-si (KR); Yoomin Ko, Yongin-si (KR); Sunho Kim, Yongin-si (KR); Hyewon Kim, Yongin-si (KR); Pilsuk Lee, Yongin-si (KR); Chung Sock Choi, Yongin-si (KR); Sungjin Hong, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/491,912

(22) Filed: Oct. 23, 2023

(65) Prior Publication Data

US 2024/0135869 A1  Apr. 25, 2024
US 2024/0233625 A9  Jul. 11, 2024

(30) Foreign Application Priority Data

Oct. 24, 2022 (KR) ........................ 10-2022-0137563

(51) Int. Cl.
G09G 3/32 (2016.01)

(52) U.S. Cl.
CPC ....... *G09G 3/32* (2013.01); *G09G 2300/0426* (2013.01); *G09G 2320/0257* (2013.01); *G09G 2320/043* (2013.01)

(58) Field of Classification Search
CPC ............ G09G 3/32; G09G 2300/0426; G09G 2320/0257; G09G 2320/043
See application file for complete search history.

(56) References Cited

U.S. PATENT DOCUMENTS

| 7,816,861 | B2 | 10/2010 | Choi et al. | |
| 7,936,322 | B2 | 5/2011 | Chung et al. | |
| 8,648,337 | B2 * | 2/2014 | Hsieh | H10K 59/124 257/40 |
| 2018/0097047 | A1 * | 4/2018 | Jung | H10K 59/123 |
| 2019/0207150 | A1 | 7/2019 | Kwon et al. | |
| 2021/0050398 | A1 * | 2/2021 | Kim | H10K 59/1216 |
| 2022/0093894 | A1 | 3/2022 | Song et al. | |

FOREIGN PATENT DOCUMENTS

| CN | 112103326 | 12/2020 |
| CN | 113972252 | 1/2022 |
| CN | 114335104 | 4/2022 |
| EP | 3 920 233 | 12/2021 |
| KR | 10-2009-0011831 | 2/2009 |
| KR | 10-1040816 | 6/2011 |

* cited by examiner

*Primary Examiner* — Hong Zhou
(74) *Attorney, Agent, or Firm* — KILE PARK REED & HOUTTEMAN PLLC

(57) ABSTRACT

A display panel including a transistor, a light-emitting element including a first electrode, a light emitting layer disposed on the first electrode, and a second electrode disposed on the light emitting layer, the second electrode being electrically connected to the transistor, an insulating layer disposed between the transistor and the light-emitting element, and connection wiring.

21 Claims, 25 Drawing Sheets

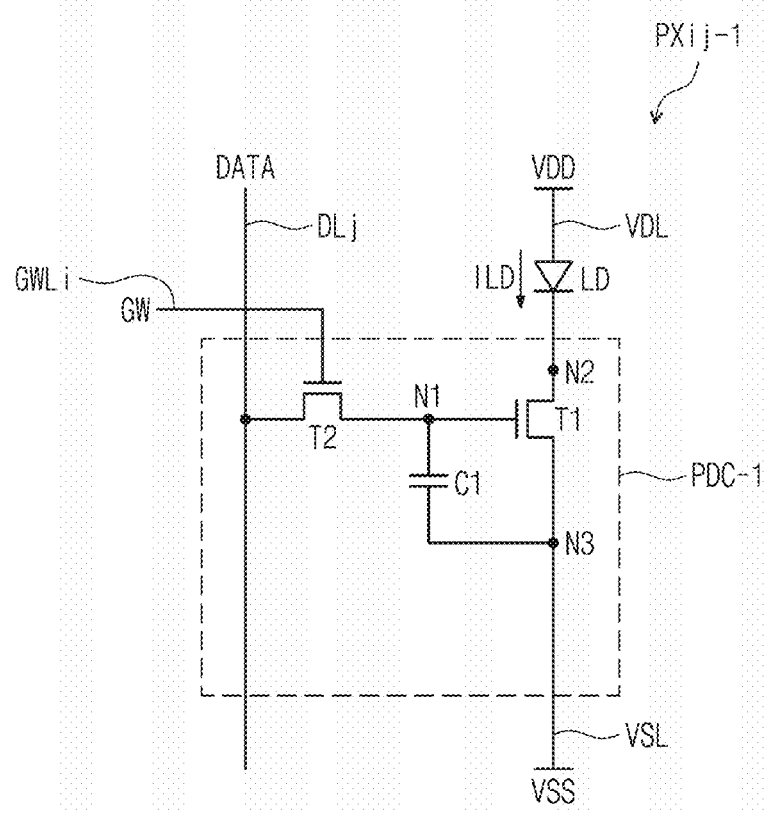

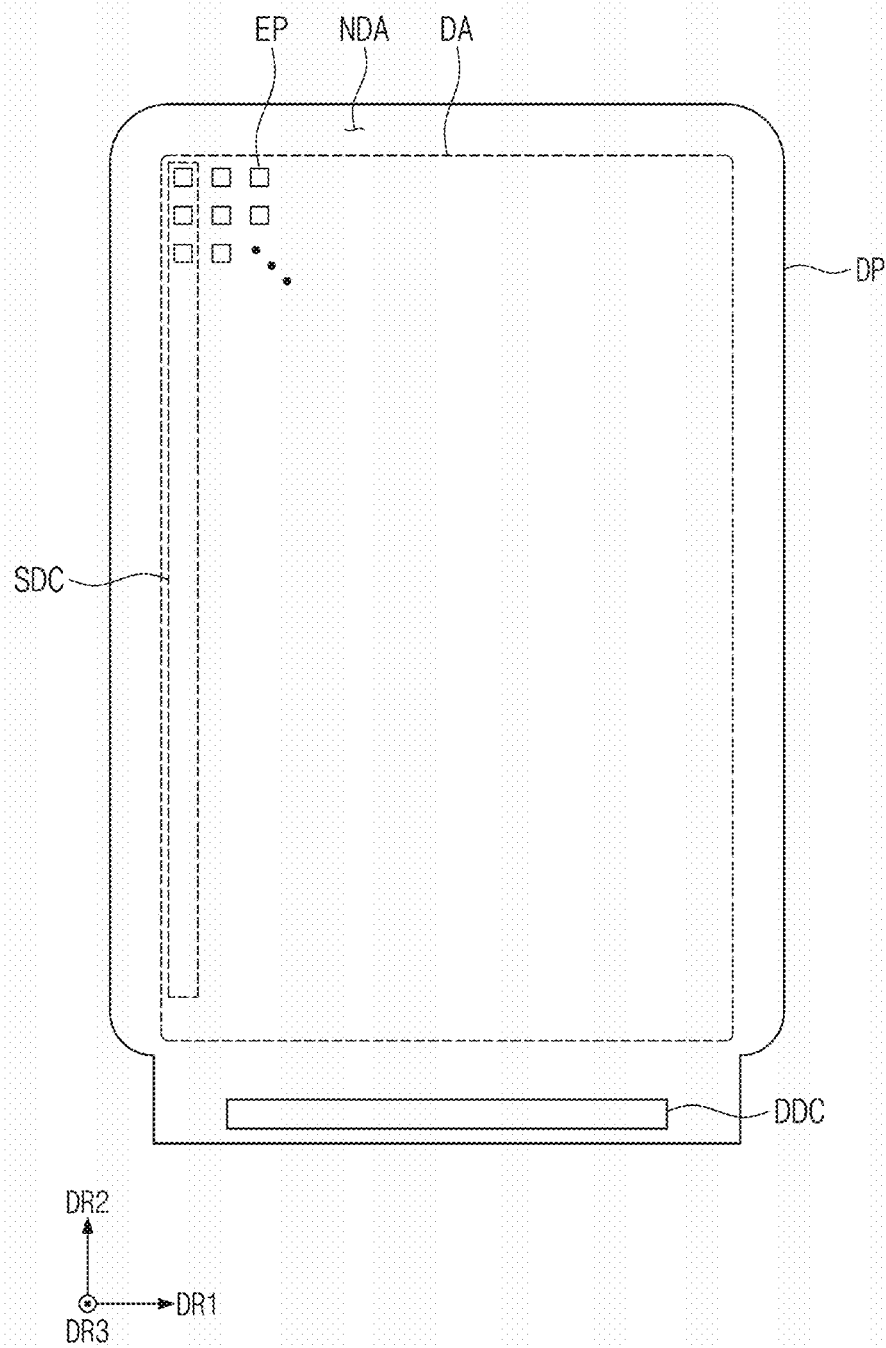

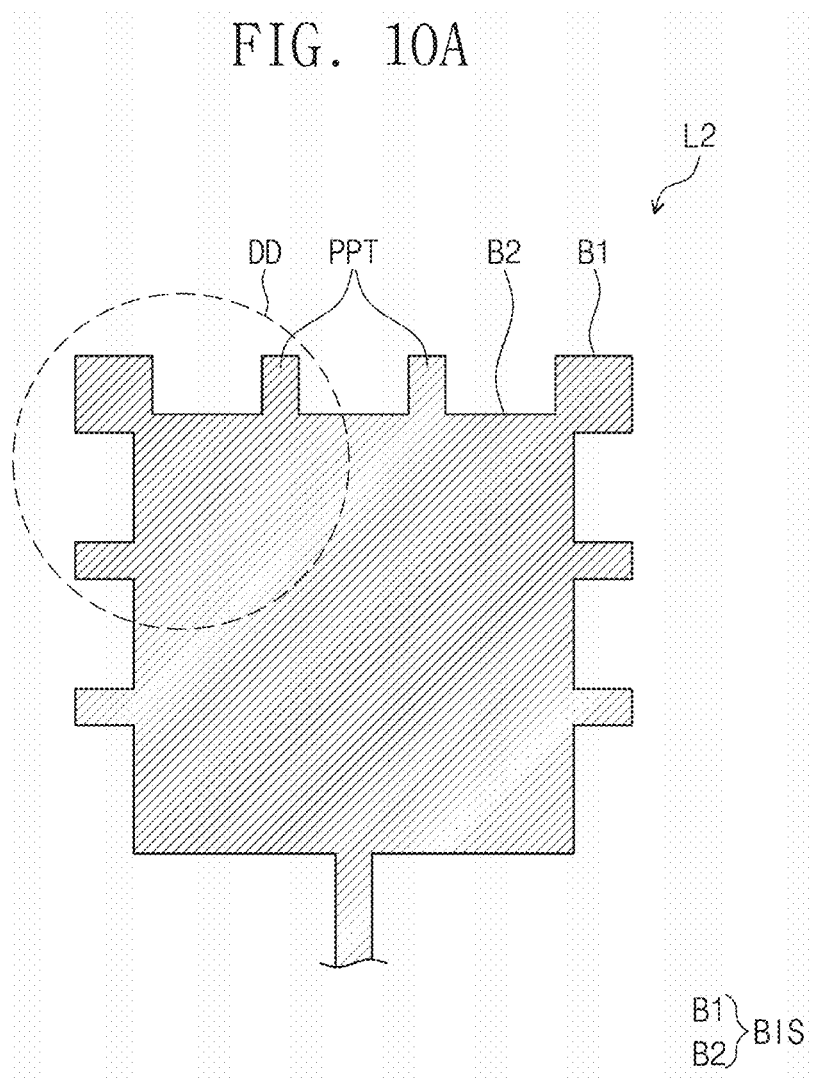

DISPLAY PANEL

CROSS-REFERENCE TO RELATED APPLICATION(S)

This application claims priority to and benefits of Korean Patent Application No. 10-2022-0137563 under 35 U.S.C. § 119, filed on Oct. 24, 2022 in the Korean Intellectual Property Office, the entire contents of which are incorporated herein by reference.

BACKGROUND

1. Technical Field

Embodiments of the disclosure described herein relate to a display panel with improved reliability.

2. Description of the Related Art

Multimedia electronic devices such as televisions, mobile phones, tablets, computers, navigation devices, and game consoles each may include a display panel for displaying an image.

A display panel may include a light-emitting element and a pixel driver for an operation of the light-emitting element. Research on a connection between the light-emitting element and a circuit in order to improve reliability of the display panel is being conducted.

SUMMARY

Embodiments of the disclosure provide a display panel in which an afterimage defect is reduced, a lifespan is improved, and electrical reliability is improved.

According to an embodiment, a display panel may include a transistor, a light-emitting element including a first electrode, a light emitting layer disposed on the first electrode, and a second electrode disposed on the light emitting layer, the second electrode being electrically connected to the transistor, an insulating layer disposed between the transistor and the light-emitting element, and a connection wiring electrically connecting the transistor and the second electrode to each other. The connection wiring may include a first contact electrically connected to the second electrode, and a second contact electrically connected to the transistor. The first contact may include a first layer, a second layer disposed on the first layer, and a third layer disposed on the second layer, the second layer including a second side end disposed between the first layer and the third layer. The second side end may include a first portion spaced apart from a third side end of the third layer by a first spacing in a plan view of the display panel, and a second portion spaced apart from the third side end by a second spacing larger than the first spacing in the plan view.

The second electrode may be partially discontinuous due to the second portion, and the second electrode may have a first end and a second end spaced apart from each other.

The first end may be disposed on the second portion and may contact the first layer and the second layer, and the second end may be disposed on the third layer.

A protruding pattern may be disposed at the second side end and may be defined by the first portion.

The first portion may include a plurality of first portions, the protruding pattern may include a plurality of protruding patterns which are defined by the plurality of first portions, and two adjacent protruding patterns among the plurality of protruding patterns may be spaced apart from each other via the second portion.

The second portion may include a plurality of second portions, and the second spacing between one of the plurality of second portions and the third side end is different from the second spacing between another one of the plurality of second portions and the third side end.

The second side end may include first to fourth edges, and the protruding pattern may be disposed at one or more of the first to fourth edges.

The protruding pattern may be disposed on each of the first edge and the third edge opposite to each other.

The second side end may include four corners, and at least one of the four corners may include the first portion.

The first contact may include a plurality of first sub-contacts, and the plurality of first sub-contacts may be electrically connected to each other.

Each of the plurality of first sub-contacts may include a sub-protruding pattern.

The sub-protruding pattern may have a rectangular shape in the plan view.

The second side end may be disposed in an area in which the insulating layer and the first contact do not overlap each other in the plan view.

The first portion may be disposed in an area in which the insulating layer and the first contact overlap each other in the plan view, and the first portion may contact the insulating layer.

According to an embodiment, a display panel may include a transistor, a light-emitting element including a first electrode, a light emitting layer disposed on the first electrode, and a second electrode disposed on the light emitting layer, the second electrode being electrically connected to the transistor, an insulating layer disposed between the transistor and the light-emitting element, and a connection wiring electrically connecting the transistor and the second electrode to each other. The connection wiring may include a first contact electrically connected to the second electrode, and a second contact electrically connected to the transistor. The first contact may include a first layer, a second layer disposed on the first layer, a third layer disposed on the second layer, and a support. Each of a first side end of the first layer and a third side end of the third layer may be positioned beyond a second side end of the second layer. A first area in which the support is disposed and a second area in which the support is not disposed may be defined in an area in which each of the first and third layers does not overlap the second layer in a plan view of the display panel.

The second electrode may be partially discontinuous due to the second area, and the second electrode may have a first end and a second end spaced apart from each other in the second area.

The first end may contact the second side end in the second area.

The first area may include a plurality of first areas, a plurality of supports may be respectively disposed in the plurality of first areas, and two adjacent supports of the plurality of supports may be spaced apart from each other via the second area.

Distances between adjacent supports among the plurality of supports may be different from each other.

The support may be in contact with the insulating layer, and the support and the insulating layer may include a same material.

The support may include a bottom face in contact with the first layer and a top face in contact with the third layer, and a shape of the bottom face and the top face may be rectangular in a plan view.

BRIEF DESCRIPTION OF THE DRAWINGS

The above and other aspects and features of the disclosure will become apparent by describing in detail embodiments thereof with reference to the accompanying drawings.

FIG. 2B is a schematic diagram of an equivalent circuit of a pixel according to an embodiment.

FIG. 3A is a schematic plan view showing a display device according to an embodiment of the disclosure.

FIG. 10A is a schematic plan view of a second layer according to an embodiment of the disclosure.

DETAILED DESCRIPTION OF THE EMBODIMENTS

Figure 1:
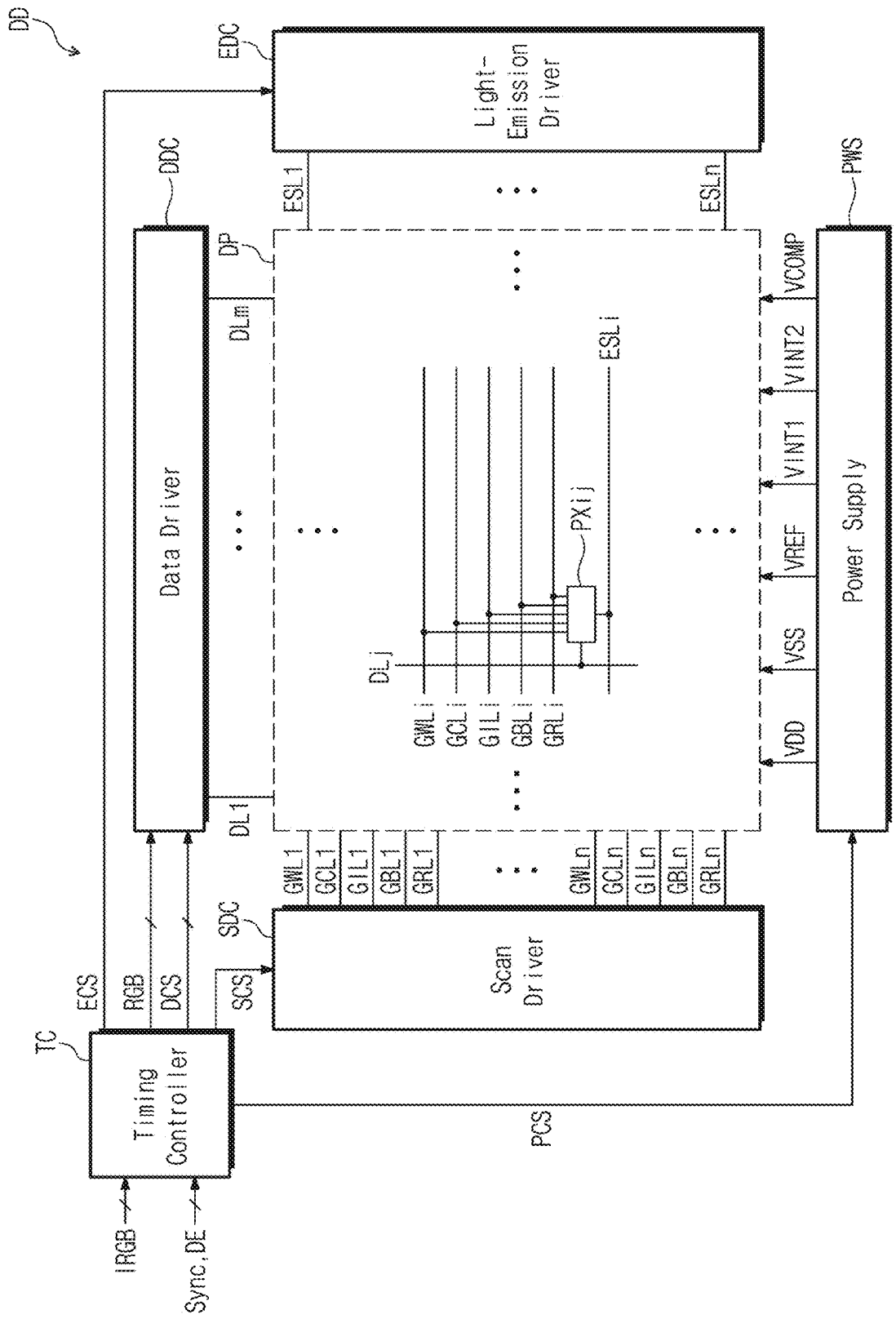
FIG. 1 is a schematic block diagram of a display device according to an embodiment.

Hereinafter, embodiments of the disclosure will be described with reference to the drawings. The disclosure may have various changes and various forms. Thus, specific embodiments will be illustrated in the drawings and described in detail herein. However, it should be understood that the specific embodiments are not intended to limit the disclosure to the specific disclosed form. The disclosure includes all modifications, equivalents, and substitutes included in the spirit and scope of the disclosure.

As used herein, when a component (or a region, a layer, a portion, and the like) is referred to as being "on", "connected to", or "coupled to" another component, it means that the component may be directly disposed/connected/coupled on another component or a third component may be disposed between the component and another component.

Like reference numerals refer to like components. In addition, in the drawings, thicknesses, ratios, and dimensions of components may be exaggerated for effective description of technical content.

In the specification and the claims, the term "and/or" is intended to include any combination of the terms "and" and "or" for the purpose of its meaning and interpretation. For example, "A and/or B" may be understood to mean any combination including "A, B, or A and B." The terms "and" and "or" may be used in the conjunctive or disjunctive sense and may be understood to be equivalent to "and/or."

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

Terms such as "first," "second," and the like may be used to describe various components, but the components should not be limited by the terms. The above terms are used only for the purpose of distinguishing one component from another. For example, without departing from the scope of the disclosure, a first component may be named as a second component, and similarly, the second component may also be named as the first component. The singular expression includes the plural expression unless the context clearly dictates otherwise.

In addition, terms such as "beneath", "below", "on", "above" are used to describe the relationship of the components illustrated in the drawings. The above terms are relative concepts, and are described with reference to directions indicated in the drawings.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

The term "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as "not overlapping" or to "not overlap" another element, this may include that the elements are spaced apart from each other, offset from each other, or set aside from each other or any other suitable term as would be appreciated and understood by those of ordinary skill in the art.

It will be understood that the terms "connected to" or "coupled to" may include a physical and/or electrical connection or coupling.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic block diagram of a display device DD according to an embodiment.

Referring to FIG. 1, the display device DD may include a display panel DP, a panel driver, and a timing controller TC. In this embodiment, an example in which the display panel DP is embodied as a light-emitting display panel is described. The light-emitting display panel may include an organic light-emitting display panel, an inorganic light-emitting display panel, or a quantum dot light-emitting display panel. In an embodiment as described later, an example in which the light-emitting display panel is embodied as the organic light-emitting display panel is described. The panel driver may include a scan driver SDC, a light-emission driver EDC, and a data driver DDC.

The display panel DP may include scan lines GWL1 to GWLn, GCL1 to GCLn, GIL1 to GILn, GBL1 to GBLn, and GRL1 to GRLn, light-emission lines ESL1 to ESLn, and data lines DL1 to DLm. The display panel DP may include pixels PXij connected to the scan lines GWL1 to GWLn, GCL1 to GCLn, GIL1 to GILn, GBL1 to GBLn, and GRL1 to GRLn, the light-emission lines ESL1 to ESLn, and the data lines DL1 to DLm (where each of m and n is an integer greater than 1).

For example, a pixel PXij (where each of i and j is an integer greater than 1) located (disposed) at an i-th horizontal line (or an i-th pixel row) and a j-th vertical line (or a j-th pixel column) may be connected to the i-th first scan line GWLi, the i-th second scan line GCLi, the i-th third scan line GILi, the i-th fourth scan line GBLi, the i-th fifth scan line GRLi, the j-th data line DLj, and the i-th light-emission line ESLi.

The pixel PXij may include multiple transistors, and multiple capacitors. The pixel PXij may receive, via a power supply PWS, a first power voltage (or a first driving voltage) VDD, a second power voltage (or a second driving voltage) VSS, a third power voltage VREF (or a reference voltage), a fourth power voltage VINT1 (or a first initialization voltage), a fifth power voltage VINT2 (or a second initialization voltage), and a sixth power voltage VCOMP (or a compensation voltage).

A voltage value of each of the first driving voltage VDD and the second driving voltage VSS may be set so that current flows in a light-emitting element to emit light. For example, the first driving voltage VDD may be set to a higher voltage level than that of the second driving voltage VSS.

The third power voltage VREF may be a voltage for initializing a gate of a driving transistor included in the pixel PXij. The third power voltage VREF may be used to implement a predefined grayscale using a voltage difference between the third power voltage VREF and a voltage of a data signal. To this end, the third power voltage VREF may be set to a predefined voltage within a voltage range of the data signal.

The fourth power voltage VINT1 may be a voltage for initializing a capacitor included in the pixel PXij. The fourth power voltage VINT1 may be set to a voltage level lower than that of the third power voltage VREF. For example, the fourth power voltage VINT1 may be set to a voltage level lower than a difference between the third power voltage VREF and a threshold voltage Vth of the driving transistor. However, the disclosure is not limited thereto. For example, the fourth power voltage VINT1 may be set to a voltage level in a range of 4V to 12V. In case that the fourth power voltage VINT1 is set to be higher than or equal to 4V, characteristics of an N-type transistor may be readily overcome. However, the disclosure is not limited thereto.

The fifth power voltage VINT2 may be a voltage for initializing a cathode of a light-emitting element LD (FIG. 2A or FIG. 2B) included in the pixel PXij.

The sixth power voltage VCOMP may supply a predefined current to the driving transistor in case compensating for the threshold voltage of the driving transistor. The fifth power voltage VINT2 may be set to a voltage level lower than that of the first driving voltage VDD or the fourth power voltage VINT1, or may be set to a voltage level similar to or equal to that of the third power voltage VREF. However, the disclosure is not limited thereto, and the fifth power voltage VINT2 may be set to a voltage level similar to or the same as that of the first driving voltage VDD.

In FIG. 1, it is illustrated that all of the first to sixth power voltages VDD, VSS, VREF, VINT1, VINT2, and VCOMP may be supplied from the power supply PWS. However, the disclosure is not limited thereto. For example, all of the first driving voltage VDD and the second driving voltage VSS may be supplied regardless of a structure of the pixel PXij, and at least one of the third power voltage VREF, the fourth power voltage VINT1, the fifth power voltage VINT2, and the sixth power voltage VCOMP may not be supplied based on the structure of the pixel PXij.

In an embodiment of the disclosure, signal lines connected to the pixel PXij may be set in various ways in a corresponding manner to a circuit structure of the pixel PXij.

The scan driver SDC may receive a first control signal SCS from the timing controller TC. Based on the first control signal SCS, the scan driver SDC may supply a scan signal to each of the first scan lines GWL1 to GWLn, the second scan lines GCL1 to GCLn, the third scan lines GIL1 to GILn, the fourth scan lines GBL1 to GBLn, and the fifth scan lines GRL1 to GRLn.

The scan signal may be set to a gate-on voltage such that each of transistors receiving the scan signal may be turned on.

For example, a scan signal supplied to a P-type transistor may be set to a logic low level, and a scan signal supplied to an N-type transistor may be set to a logic high level. Hereinafter, "a scan signal is supplied" may be understood as a scan signal at a logic level that turns on a transistor controlled by the scan signal being supplied.

In FIG. 1, for convenience of illustration, the scan driver SDC is shown as a single component. However, the disclosure is not limited thereto. According to an embodiment, multiple scan drivers may be included to supply a scan signal to each of the first scan lines GWL1 to GWLn, the second scan lines GCL1 to GCLn, the third scan lines GIL1 to GILn, the fourth scan lines GBL1 to GBLn, and the fifth scan lines GRL1 to GRLn.

The light-emission driver EDC may supply a light-emission signal to the light-emission lines ESL1 to ESLn based on a second control signal ECS. For example, the light-emission signal may be sequentially supplied to the light-emission lines ESL1 to ESLn.

Each of transistors connected to the light-emission lines ESL1 to ESLn according to the disclosure may be embodied as an N-type transistor. In this regard, the light-emission signal supplied to the light-emission lines ESL1 to ESLn may be set to a gate-off voltage (e.g., a logic high level). The transistors may be turned off in case that the light-emission signal is supplied thereto. Otherwise, the transistors may be set to a turned-on state.

The second control signal ECS may include a light-emission start signal and clock signals. The light-emission driver EDC may be implemented as a shift register that sequentially shifts a pulse-type light-emission start signal using the clock signals to sequentially generate and output a pulse-type light-emission signal.

The data driver DDC may receive a third control signal DCS and image data RGB from the timing controller TC. The data driver DDC may convert the image data RGB in a form of a digital signal into an analog data signal (i.e., a data signal). The data driver DDC may supply the data signal to the data lines DL1 to DLm in response to the third control signal DCS.

The third control signal DCS may include a data enable signal instructing output of a valid data signal, a horizontal start signal, a data clock signal, and the like. For example, the data driver DDC may include a shift register which shifts the horizontal start signal in synchronization with the data clock signal to generate a sampling signal, a latch that latches the image data RGB in response to the sampling signal, a digital-to-analog converter (or a decoder) that converts the latched image data (e.g., the digital data) into analog data signals, and buffers (or amplifiers) that output the data signals to the data lines DL1 to DLm.

The power supply PWS may supply the first driving voltage VDD, the second driving voltage VSS, and the third power voltage VREF for operation of the pixel PXij to the display panel DP. Further, the power supply PWS may supply at least one voltage of the fourth power voltage VINT1 or the fifth power voltage VINT2 to the display panel DP.

Figure 2A:
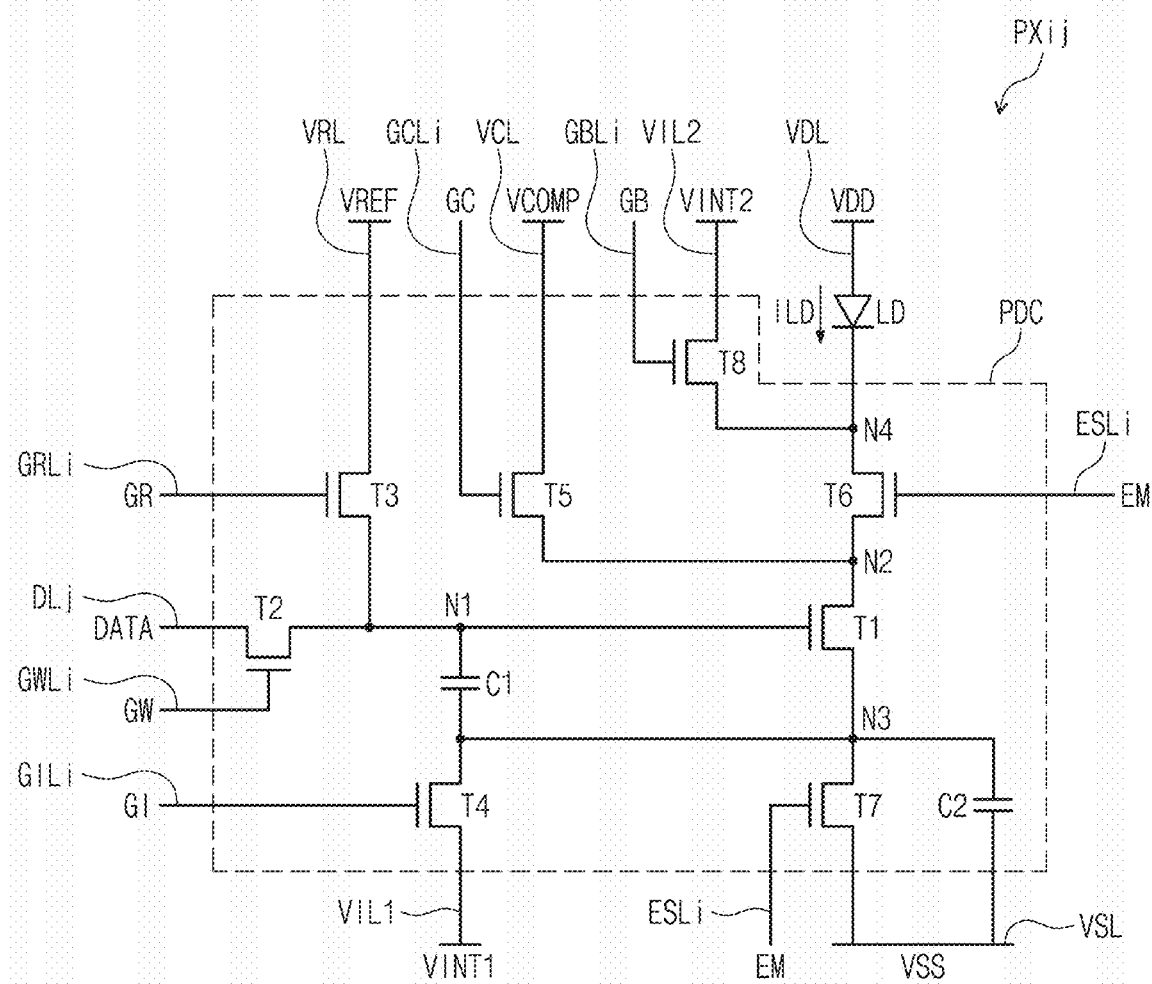
FIG. 2A is a schematic diagram of an equivalent circuit of a pixel according to an embodiment.

In one example, the power supply PWS may supply, to the display panel DP, each of the first driving voltage VDD, the second driving voltage VSS, the third power voltage VREF, the fourth power voltage VINT1, the fifth power voltage VINT2, and the sixth power voltage VCOMP via each of a first driving voltage line VDL, a second driving voltage line VSL, a third power line (or a reference power line) VRL, a fourth power line (or a first initialization power line) VIL1, a fifth power line (or a second initialization power line) VIL2, and a sixth power line (or a compensation line) VCL as shown in FIG. 2A.

The power supply PWS may be implemented as a power management integrated circuit (PMIC). However, this is merely an example, and the disclosure is not limited thereto.

The timing controller TC may generate the first control signal SCS, the second control signal ECS, the third control signal DCS, and a fourth control signal PCS, based on input image data IRGB, a synchronization signal Sync (e.g., a vertical synchronization signal, a horizontal synchronization signal, etc.), a data enable signal DE, and a clock signal, etc. The first control signal SCS may be supplied to the scan driver SDC, and the second control signal ECS may be supplied to the light-emission driver EDC, the third control signal DCS may be supplied to the data driver DDC, and the fourth control signal PCS may be supplied to the power supply PWS. The timing controller TC may rearrange the input image data IRGB in correspondence with an arrangement of the pixel PXij in the display panel DP to generate the image data RGB (or a frame data).

In one example, the scan driver SDC, the light-emission driver EDC, the data driver DDC, the power supply PWS, and/or the timing controller TC may be directly formed on the display panel DP, or may be provided (disposed) in a form of a separate driver chip and connected to the display panel DP. Further, at least two of the scan driver SDC, the light-emission driver EDC, the data driver DDC, the power supply PWS, or the timing controller TC may be provided as one driver chip. For example, the data driver DDC and the timing controller TC may be provided as one driver chip.

The display device DD according to an embodiment has been described above with reference to FIG. 1. However, display device of the disclosure is not limited thereto. Depending on a pixel configuration, additional signal lines may be added or omitted. Further, a connection relationship between one pixel and the signal lines may be changed. In case that one of the signal lines is omitted, another signal line may replace the omitted signal line.

FIG. 2A and FIG. 2B are schematic diagrams of equivalent circuits of pixels. FIG. 2A and FIG. 2B respectively show equivalent circuit diagrams of pixels PXij and PXij−1 connected to the i-th first scan line GWLi (hereinafter, a first scan line) and connected to the j-th data line DLj (hereinafter, a data line) by way of example.

As shown in FIG. 2A, the pixel PXij may include the light-emitting element LD and a pixel driver PDC. The light-emitting element LD may be connected to the first driving voltage line VDL and the pixel driver PDC.

The pixel driver PDC may be connected to the scan lines GWLi, GCLi, GILi, GBLi, and GRLi, the data line DLj, the light-emission line ESLi, and the power voltage lines VDL, VSL, VIL1, VIL2, VRL, and VCL. The pixel driver PDC may include first to eighth transistors T1, T2, T3, T4, T5, T6, T7, and T8, a first capacitor C1, and a second capacitor C2. Hereinafter, a case in which each of the first to eighth transistors T1, T2, T3, T4, T5, T6, T7, and T8 is embodied as an N-type transistor is described by way of example. However, this is merely an example, and the disclosure is not limited thereto. Each of some of the first to eighth transistors T1 to T8 may be an N-type transistor, while each of the others thereof may be a P-type transistor, or each of the first to eighth transistors T1 to T8 may be a P-type transistor. However, the disclosure is not limited thereto.

A gate of the first transistor T1 may be connected to a first node N1. A first electrode of the first transistor T1 may be connected to a second node N2 and a second electrode thereof may be connected to a third node N3. The first transistor T1 may be a driving transistor. The first transistor T1 may control a driving current ILD flowing from the first driving voltage line VDL to the second driving voltage line VSL via the light-emitting element LD in response to a voltage of the first node N1. In this regard, the first driving voltage VDD may be set to a voltage level having a higher potential than that of the second driving voltage VSS.

As used herein, "a transistor and a signal line being electrically connected to each other or a transistor and a transistor being electrically connected to each other" means that "a source, a drain, or gate of the transistor has an integral structure with the signal line or is connected thereto via a connecting electrode."

The second transistor T2 may include a gate connected to the first scan line GWLi, a first electrode connected to the data line DLj, and a second electrode connected to the first node N1. The second transistor T2 may supply a data signal DATA to the first node N1 in response to a first scan signal GW transmitted via the first scan line GWLi. The second transistor T2 may be a switching transistor. In case that the first scan signal GW is supplied to the first scan line GWLi, the second transistor T2 may be turned on to electrically connect the data line DLj and the first node N1 to each other.

The third transistor T3 may be connected to and disposed between the first node N1 and the reference voltage line VRL. A first electrode of the third transistor T3 may receive the reference voltage VREF via the reference voltage line VRL, and a second electrode of the third transistor T3 may be connected to the first node N1. In this embodiment, a gate of the third transistor T3 may receive a reset scan signal GR via the i-th fifth scan line GRLi (hereinafter, a fifth scan line). In case that the reset scan signal GR is supplied to the fifth scan line GRLi, the third transistor T3 may be turned on to provide the reference voltage VREF to the first node N1.

The fourth transistor T4 may be connected to and disposed between the third node N3 and the first initialization voltage line VIL1. A first electrode of the fourth transistor T4 may be connected to the third node N3, and a second electrode of the fourth transistor T4 may be connected to the first initialization voltage line VIL1 providing the first initialization voltage VINT1. A gate of the fourth transistor T4 may receive an initialization scan signal GI via the i-th third scan line GILi (hereinafter, a third scan line). In case that the initialization scan signal GI is supplied to the third scan line GILi, the fourth transistor T4 may be turned on to supply the first initialization voltage VINT1 to the third node N3.

The fifth transistor T5 may be connected to and disposed between the compensation voltage line VCL and the second node N2. A first electrode of the fifth transistor T5 may receive the compensation voltage VCOMP via the compensation voltage line VCL, and a second electrode of the fifth transistor T5 may be connected to the second node N2 and thus may be electrically connected to the first electrode of the first transistor T1. A gate of the fifth transistor T5 may receive a compensation scan signal GC via the i-th second scan line GCLi (hereinafter, a second scan line). In case that the compensation scan signal GC is supplied to the second scan line GCLi, the fifth transistor T5 may be turned on to provide the compensation voltage VCOMP to the second node N2, such that during a compensation period, a threshold voltage Vth of the first transistor T1 may be compensated for.

The sixth transistor T6 may be connected to and disposed between the first transistor T1 and the light-emitting element LD. Specifically, a gate of the sixth transistor T6 may receive a light-emission signal EM via the i-th light-emission line ESLi (hereinafter, a light-emission line). A first electrode of the sixth transistor T6 may be connected to a cathode of the light-emitting element LD via a fourth node N4, and a second electrode of the sixth transistor T6 may be connected to the first electrode of the first transistor T1 via the second node N2. The sixth transistor T6 may be referred to as a first light-emission control transistor. In case that the light-emission signal EM is supplied to the light-emission line ESLi, the sixth transistor T6 may be turned on to electrically connect the light-emitting element LD and the first transistor T1 to each other.

The seventh transistor T7 may be connected to and disposed between the second driving voltage line VSL and the third node N3. A first electrode of the seventh transistor T7 may be connected to the second electrode of the first transistor T1 via the third node N3, and a second electrode of the seventh transistor T7 may receive the second driving voltage VSS via the second driving voltage line VSL. A gate of the seventh transistor T7 may be electrically connected to the light-emission line ESLi. The seventh transistor T7 may be referred to as a second light-emission control transistor. In case that the light-emission signal EM is supplied to the light-emission line ESLi, the seventh transistor T7 may be turned on to electrically connect the second electrode of the first transistor T1 and the second driving voltage line VSL to each other.

In this example embodiment, it is illustrated that the sixth transistor T6 and the seventh transistor T7 are connected to the same light-emission line ESLi and are turned on based on the same light-emission signal EM. However, this is merely an example. The disclosure is not limited thereto. For example, the sixth transistor T6 and the seventh transistor T7 may be independently turned on based on different signals. Further, in the pixel driver PDC according to an embodiment of the disclosure, one of the sixth transistor T6 and the seventh transistor T7 may be omitted.

The eighth transistor T8 may be connected to and disposed between the second initialization voltage line VIL2 and the fourth node N4. For example, the eighth transistor T8 may include a gate connected to the i-th fourth scan line GBLi (hereinafter, a fourth scan line), a first electrode connected to the second initialization voltage line VIL2, and a second electrode connected to the fourth node N4. The eighth transistor T8 may be referred to as a second initialization transistor. The eighth transistor T8 may respond to a black scan signal GB transmitted via the fourth scan line GBLi to supply the second initialization voltage VINT2 to a cathode of the light-emitting element LD and a corresponding fourth node N4. The cathode of the light-emitting element LD may be initialized by the second initialization voltage VINT2.

In this example embodiment, some of the second to eighth transistors T2, T3, T4, T5, T6, T7, and T8 may be simultaneously turned on based on the same scan signal. For example, the eighth transistor T8 and the fifth transistor T5 may be simultaneously turned on based on the same scan signal. For example, the eighth transistor T8 and the fifth transistor T5 may operate based on the same compensation scan signal GC. Because the eighth transistor T8 and the fifth transistor T5 are turned on/off based on the same compensation scan signal GC, the eighth transistor T8 and the fifth transistor T5 may be turned on/off at the same time. The second scan line GCLi and the fourth scan line GBLi may be substantially provided as a single scan line. Accordingly, the initialization of the cathode of the light-emitting element LD and the compensation for the threshold voltage of the first transistor T1 may be performed at the same time. However, this is merely an example, and the disclosure is not limited thereto.

Further, according to the disclosure, the initialization of the cathode of the light-emitting element LD and the compensation for the threshold voltage of the first transistor T1 may be performed via application of the same power voltage. For example, the compensation voltage line VCL and the second initialization voltage line VIL2 may be substantially provided as a single power voltage line. The initialization operation of the cathode and the compensation operation for the threshold voltage of the driving transistor may be performed based on a single power voltage. Thus, a driver design may be simplified. However, this is merely an example, and the disclosure is not limited thereto.

The first capacitor C1 may be disposed between the first node N1 and the third node N3. The first capacitor C1 may store therein a difference between voltage levels of the first node N1 and the third node N3. The first capacitor C1 may be referred to as a storage capacitor.

The second capacitor C2 may be disposed between the third node N3 and the second driving voltage line VSL. For example, one electrode of the second capacitor C2 may be connected to the second driving voltage line VSL supplied with the second driving voltage VSS, and the other electrode of the second capacitor C2 may be connected to the third node N3. The second capacitor C2 may store therein electric charges corresponding to a difference between voltage levels of the second driving voltage VSS and the second node N2. The second capacitor C2 may be referred to as a hold capacitor. The second capacitor C2 may have a higher storage capacity than that of the first capacitor C1. Accordingly, the second capacitor C2 may minimize change in a voltage of the third node N3 in response to change in a voltage of the first node N1.

In this embodiment, the light-emitting element LD may be connected to the pixel driver PDC via the fourth node N4. The light-emitting element LD may include an anode connected to the first driving voltage line VDL and the cathode opposite to the anode. In this embodiment, the light-emitting element LD may be connected to the pixel driver PDC via the cathode. For example, in the pixel PXij according to the disclosure, a connection node where the light-emitting element LD and the pixel driver PDC are connected to each other may be the fourth node N4, and the fourth node N4 may correspond to a connection node between the first electrode of the sixth transistor T6 and the cathode of the light-emitting element LD.

Accordingly, a potential of the fourth node N4 may substantially correspond to a potential of the cathode of the light-emitting element LD. For example, the anode of the light-emitting element LD may be connected to the first driving voltage line VDL such that the first driving voltage VDD as a constant voltage is applied thereto. The cathode thereof may be connected to the first transistor T1 via the sixth transistor T6 and a potential thereof may be controlled. For example, an electric potential of the second node N2 corresponding to a source of the first transistor T1 may not be directly affected by the characteristics of the light-emitting element LD. Therefore, even in case that characteristics of the light-emitting element LD are deteriorated due to the lifetime of the light-emitting element LD, an effect on a gate-source voltage Vgs of each of the transistors constituting the pixel driver PDC, particularly, the driving transistor may be reduced. For example, change in the current amount due to the deterioration of the light-emitting element LD may be reduced, such that an afterimage defect of the display panel due to increase in a use time may be reduced, and a lifespan of the display panel may be improved.

In other embodiments, as shown in FIG. 2B, the pixel PXij−1 may include a pixel driver PDC-1 including two transistors T1 and T2 and one capacitor C1. The pixel driver PDC-1 may be connected to the light-emitting element LD, the first scan line GWLi, the data line DLj, and the second driving voltage line VSL. The pixel driver PDC-1 as shown in FIG. 2B may correspond to a case in which the third to eighth transistors T3 to T8 and one capacitor C2 are omitted from the pixel driver PDC as shown in FIG. 2A.

Each of the first and second transistors T1 and T2 may be N-type or P-type transistor. In this embodiment, an example in which each of the first and second transistors T1 and T2 is an N-type transistor is described.

The first transistor T1 may include a gate connected to the first node N1, a first electrode connected to the second node N2, and a second electrode connected to the third node N3. The second node N2 may be a node connected to the first driving voltage line VDL, and the third node N3 may be a node connected to the second driving voltage line VSL. The first transistor T1 may be connected to the light-emitting element LD via the second node N2 and connected to the second driving voltage line VSL via the third node N3. The first transistor T1 may be a driving transistor.

The second transistor T2 may include a gate for receiving the first scan signal GW via the first scan line GWLi, a first electrode connected to the data line DLj, and a second electrode connected to the first node N1. The second transistor T2 may supply the data signal DATA to the first node N1 in response to the first scan signal GW transmitted via the first scan line GWLi.

The capacitor C1 may include an electrode connected to the first node N1 and an electrode connected to the third node N3. The capacitor C1 may store therein the data signal DATA transmitted to the first node N1.

The light-emitting element LD may include an anode and a cathode. In this embodiment, the anode of the light-emitting element LD may be connected to the first driving voltage line VDL, and the cathode may be connected to the pixel driver PDC-1 via the second node N2. In this embodiment, the cathode of the light-emitting element LD may be connected to the first transistor T1. The light-emitting element LD may emit light in response to an amount of current flowing through the first transistor T1 of the pixel driver PDC-1.

The second node N2 at which the cathode of the light-emitting element LD and the pixel driver PDC-1 are connected to each other may correspond to a drain of the first transistor T1. The light-emitting element LD may be connected to the pixel driver PDC-1 via the second node N2. For example, in the pixel PXij−1 as shown in FIG. 2B, the connection node at which the light-emitting element LD and the pixel driver PDC-1 are connected to each other may be the second node N2, and the second node N2 may correspond to a connection node between the first electrode of the first transistor T1 and the cathode of the light-emitting element LD.

For example, in the display panel of the disclosure, in case that the driving transistor is an N-type transistor, a change in the gate-source voltage of the first transistor T1 caused by the light-emitting element LD may be suppressed. Accordingly, change in the current amount due to deterioration of the light-emitting element LD may be reduced, such that an afterimage defect of the display panel due to increase in a use time may be reduced and thus the lifespan thereof may be improved.

In examples, FIG. 2A and FIG. 2B respectively show circuits of the pixel drivers PDC and PDC-1 according to embodiments of the disclosure. However, this is merely an example, and the disclosure is not limited thereto. As long as the pixel driver according to an embodiment is a circuit connected to the cathode of the light-emitting element LD, the number and/or arrangement relationship of transistors thereof and the number and/or arrangement relationship of capacitors thereof may be designed in various ways.

Figure 3B:
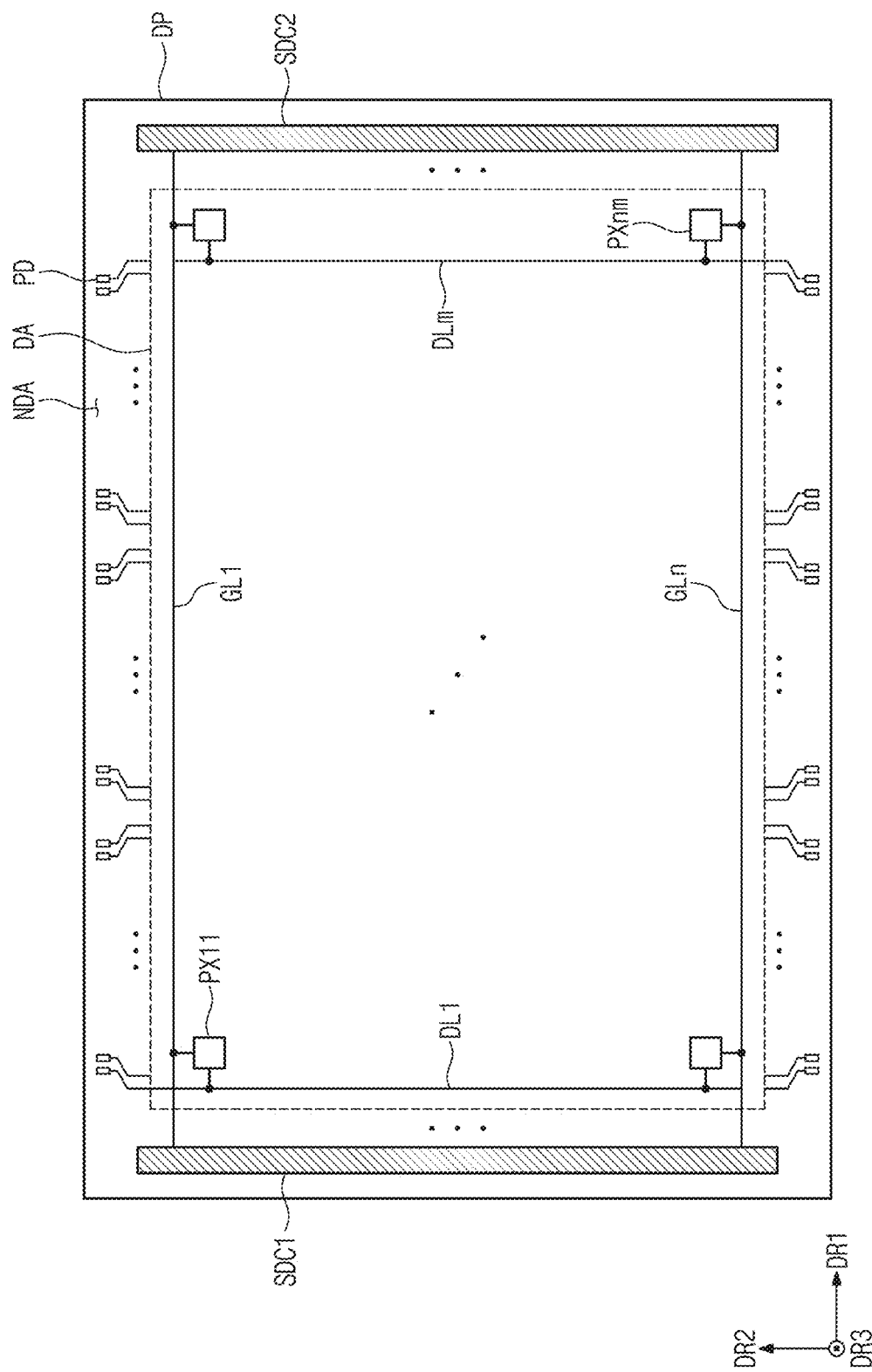
FIG. 3B is a schematic plan view showing a display device according to an embodiment of the disclosure.

FIG. 3A and FIG. 3B are schematic plan views showing a display device, and some components are omitted in FIG. 3A and FIG. 3B. Hereinafter, the disclosure will be described with reference to FIG. 3A and FIG. 3B. Referring to FIG. 3A, the display panel DP of an embodiment may be divided into a display area DA and a peripheral area NDA. The display area DA may include multiple light-emitting areas EP.

The light-emitting areas EP may be respective areas of the pixels PXij (FIG. 1) to emit light. Specifically, each of the light-emitting areas EP may correspond to a light-emitting opening OP-PDL as described later.

The peripheral area NDA may be adjacent to the display area DA. In this embodiment, the peripheral area NDA is shown as having a shape surrounding an edge of the display area DA. However, this is shown by way of example, and the peripheral area NDA may be disposed on one side of the display area DA or may be omitted. The disclosure is not limited thereto.

In this embodiment, the scan driver SDC and the data driver DDC may be mounted in the display panel DP. In an embodiment, the scan driver SDC may be disposed in the display area DA, and the data driver DDC may be disposed in the peripheral area NDA. The scan driver SDC may overlap at least some of the light-emitting areas EP disposed in the display area DA in a plan view. As the scan driver SDC is disposed in the display area DA, an area size of the peripheral area NDA of the display panel DP of an embodiment of the disclosure may be reduced compared to that in a conventional display panel in which the scan driver is disposed in the peripheral area. Thus, a display device with a narrow bezel may be readily implemented.

FIG. 3A shows one scan driver SDC by way of example. However, the disclosure is not limited thereto. For example, the scan driver SDC may be provided as two separate scan drivers. The two scan drivers SDC may be spaced apart from each other and may be respectively disposed in left and right sides of the display area DA while a center thereof is interposed therebetween. In other embodiments, the number of the scan drivers SDC may be two or greater. The disclosure is not limited thereto.

In one example, FIG. 3A shows one example of the display device. The data driver DDC may be disposed in the display area DA. In this regard, some of the light-emitting areas EP disposed in the display area DA may overlap the data driver DDC in a plan view.

The data driver DDC may be provided in a form of a separate driver chip independent of the display panel DP and may be connected to the display panel DP. However, this is merely an example, and the data driver DDC and the scan driver SDC may be formed in the same process to constitute the display panel DP. The disclosure is not limited thereto.

In other embodiments, as shown in FIG. 3B, the display device may include the display panel including a long side extending in a first direction DR1. In this embodiment, the display device may include multiple scan drivers SDC1 and SDC2. The scan drivers SDC1 and SDC2 are illustrated as including the first scan driver SDC1 and the second scan driver SDC2 spaced apart from each other in the first direction DR1.

The first scan driver SDC1 may be connected to some of scan lines GL1 to GLn and the second scan driver SDC2 may be connected to others of scan lines GL1 to GLn. For example, the first scan driver SDC1 may be connected to odd scan lines GL1 to GL2n−1 among the scan lines GL1 to GLn, and the second scan driver SDC2 may be connected to even scan lines GL2 to GL2n among the scan lines GL1 to GLn.

FIG. 3B shows pads PD of the data lines DL1 to DLm for convenience of illustration. The pads PD may be respectively defined at ends of the data lines DL1 to DLm. The data lines DL1 to DLm may be connected to the data driver DDC (FIG. 3A) via the pads PD. FIG. 3B also includes pixels PX11 and PXnm and appropriate connections thereto.

According to the disclosure, the pads PD may be divided into two groups disposed in the peripheral area NDA and spaced apart from each other while the display area DA is interposed therebetween. For example, some of the pads PD may be disposed in an upper area, that is, in an area adjacent to the first scan line GL1 among the scan lines GL1 to GLn, and others of the pads PD may be disposed in a lower area, that is, an area adjacent to the last scan line GL2n among the scan lines GL1 to GLn. In this embodiment, pads PD connected to odd data lines DL1 to DL2m−1 among the pads PD may be disposed in the upper area, and pads PD connected to even data lines DL2 to DL2m among the pads PD may be disposed in the lower area. Although not shown, the data driver may include three upper data drivers respectively connected to the pads PD disposed in the upper area and three lower data drivers respectively connected to the pads PD disposed in the lower area. However, this is merely an example. One upper data driver connected to the pads PD may be disposed in the upper area, and one lower data driver connected to the pads PD may be disposed in the lower area. In other embodiments, the pads PD according to an embodiment of the disclosure may be disposed in one area and may be connected to a single data driver. The disclosure is not limited thereto.

Figure 4A:
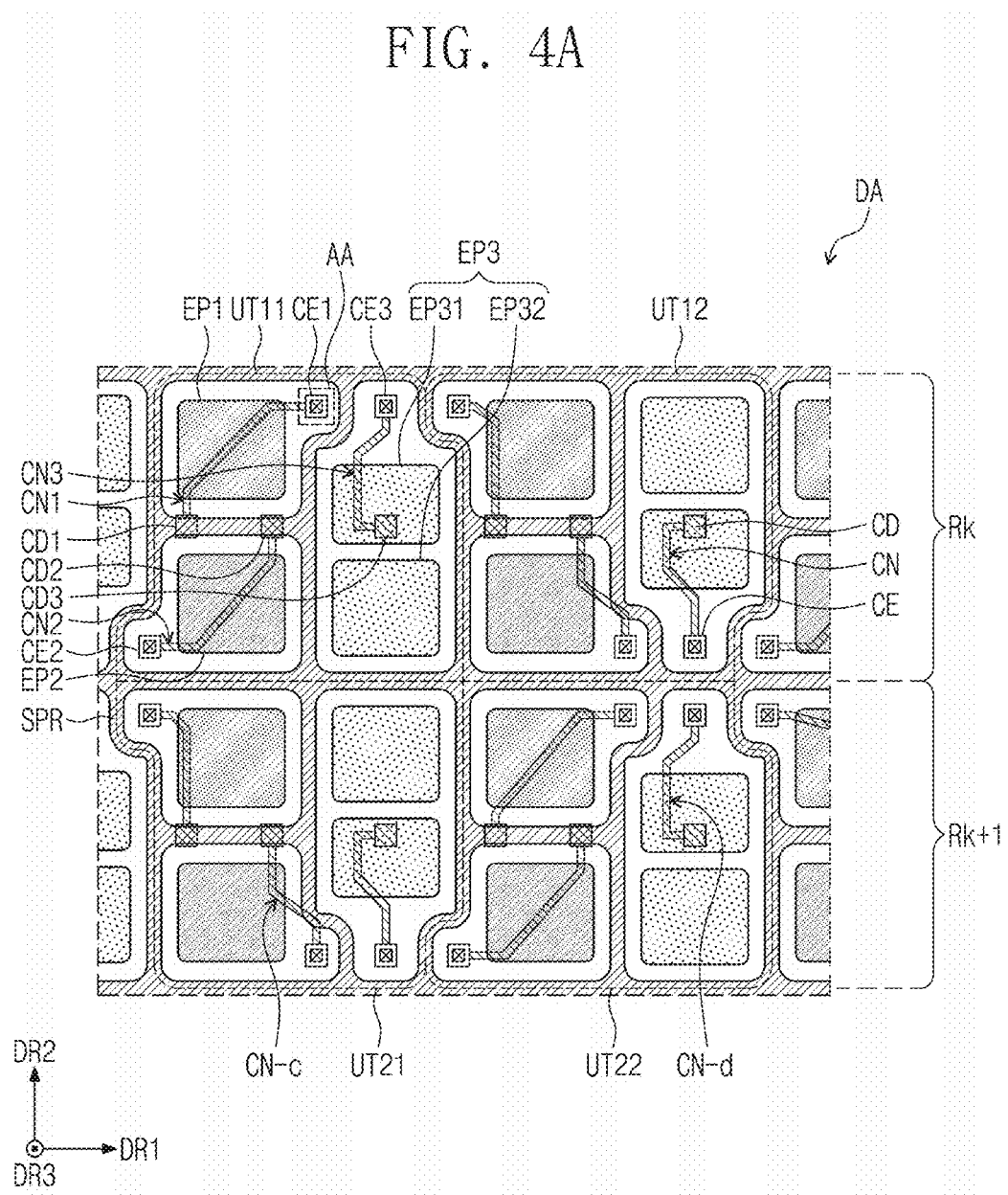
FIG. 4A is an enlarged schematic plan view showing a partial area of a display panel according to an embodiment.
Figure 4B:
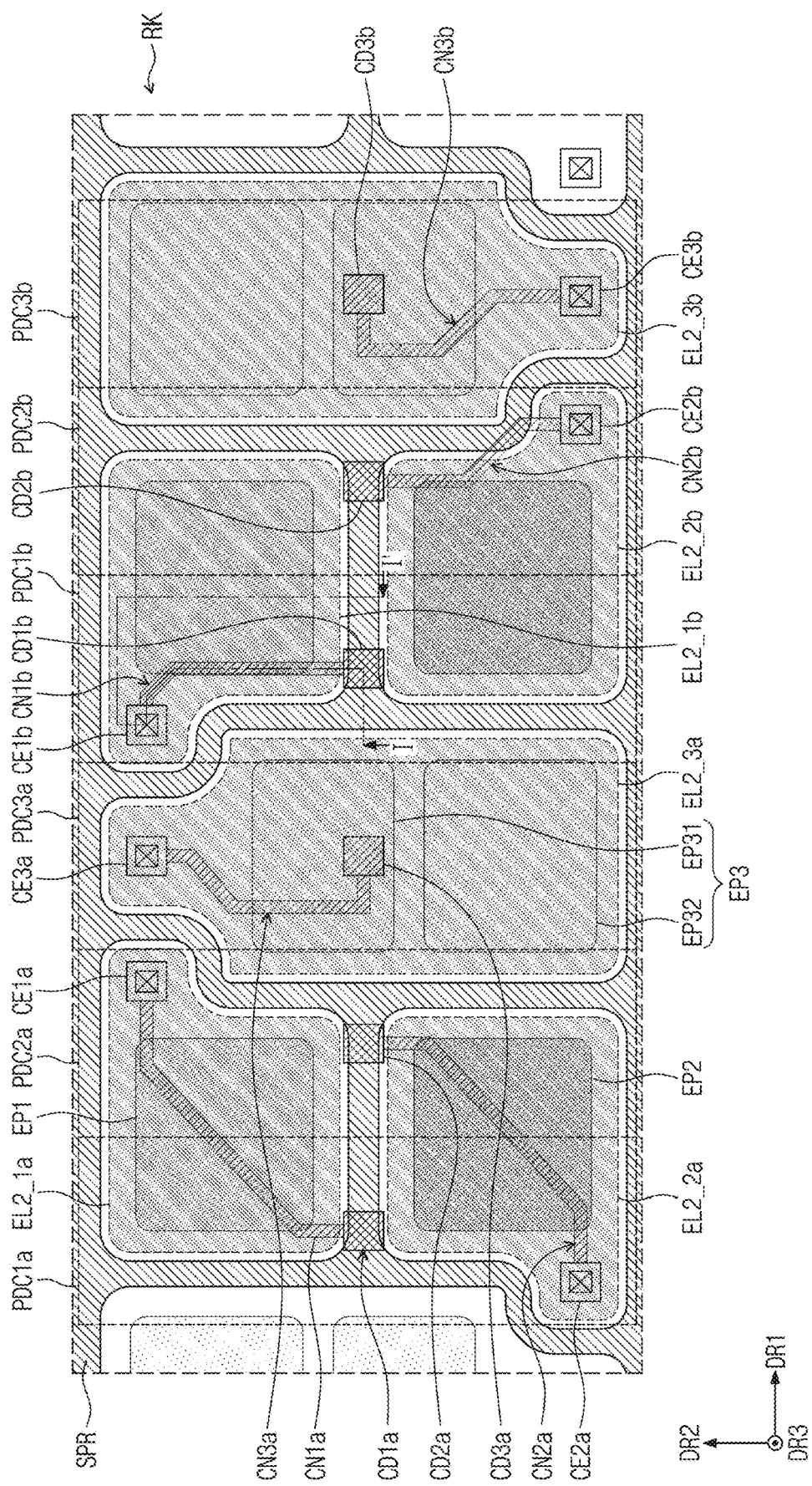
FIG. 4B is an enlarged schematic plan view showing a partial area of a display panel according to an embodiment.
Figure 4C:
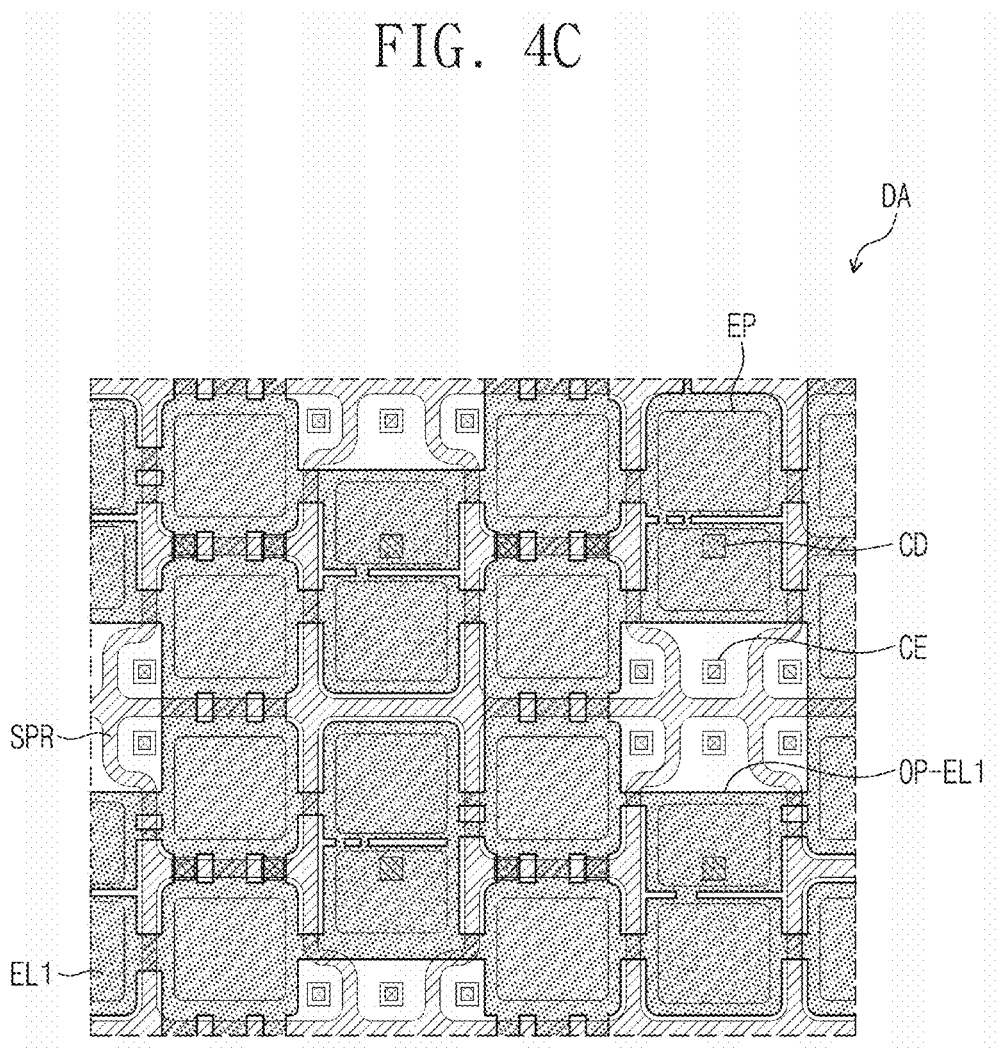
FIG. 4C is an enlarged schematic plan view showing a partial area of the display panel according to an embodiment.

FIG. 4A to FIG. 4C are enlarged schematic plan views of a partial area of the display panel DP. FIG. 4A shows an area where (or in which) four light-emitting units are arranged in 2 rows and 2 columns, and FIG. 4B shows an enlarged view of light-emitting areas of a first row Rk as shown in FIG. 4A. In FIG. 4C, some components among components as shown in FIG. 4A are omitted or emphasized. Hereinafter, the disclosure will be described with reference to FIG. 4A to FIG. 4C.

FIG. 4A shows light-emitting units UT11, UT12, UT21, and UT22 arranged in two rows and two columns. The light-emitting areas of the first row Rk may include light-emitting areas constituting a first row first column light-emitting unit UT11 and a first row second column light-emitting unit UT12. The light-emitting areas of a second row Rk+1 may include light-emitting areas constituting a second row first column light-emitting unit UT21 and a second row second column light-emitting unit UT22. In FIG. 4A to FIG. 4C, a separator SPR, multiple light-emitting areas EP1, EP2, and EP3 disposed in an area defined by the separator SPR, connection wirings CN1, CN2 and CN3, a first electrode EL1, and second electrodes EL2_1, EL2_2, and EL2_3 among components of the display panel DP are shown.

As described above, each of the light-emitting areas EP1, EP2, and EP3 may correspond to the light-emitting opening OP-PDL (FIG. 5) as described later. For example, each of the light-emitting areas EP1, EP2, and EP3 may be an area in which the above-described light-emitting element LD emits light, and may correspond to a unit generating an image displayed on the display panel DP. More specifically, each of the light-emitting areas EP may correspond to an area defined by the light-emitting opening OP-PDL as described later, particularly an area defined by a bottom face of the light-emitting opening OP-PDL.

The light-emitting areas EP1, EP2 and EP3 may include the first light-emitting area EP1, the second light-emitting area EP2, and the third light-emitting area EP3. The first light-emitting area EP1, the second light-emitting area EP2, and the third light-emitting area EP3 may display light of different colors. For example, the first light-emitting area EP1 may emit red light, the second light-emitting area EP2 may emit green light, and the third light-emitting area EP3 may emit blue light. However, the disclosure is not limited thereto. At least two of the light-emitting areas EP1, EP2 and EP3 may emit light of the same color. For example, all of the first to third light-emitting areas EP1, EP2, and EP3 may emit blue light or may emit white light.

In one example, the third light-emitting area EP3 emitting light emitted from a third light-emitting element among the light-emitting areas EP1, EP2 and EP3 may include two sub-light-emitting areas EP31 and EP32 spaced apart from each other in a second direction DR2. However, this is shown by way of example, and the third light-emitting area EP3 may be provided as one pattern having an integral structure as in each of the first and second light-emitting areas EP1 and EP2. At least one of the first and second light-emitting areas EP1 and EP2 may include sub-light-emitting areas. The disclosure is not limited thereto.

In this embodiment, the light-emitting areas of the first row Rk may constitute the first row first column light-emitting units UT11 and the first row second column light-emitting units UT12 which are repeatedly arranged. The light-emitting areas of the second row Rk+1 may constitute the second row first column light-emitting units UT21 and the second row second column light-emitting units UT22 which are repeatedly arranged. In this regard, the light-emitting areas constituting the first row first column light-emitting unit UT11 and the light-emitting areas constituting the second row first column light-emitting unit UT21 may be arranged in a symmetric manner with each other in an axis parallel to the second direction DR2. The light-emitting areas constituting the first row second column light-emitting unit UT12 and the light-emitting areas constituting the second row second column light-emitting unit UT22 may be arranged in a symmetric manner with each other in an axis parallel to the second direction DR2. Further, contacts of connection wirings connected to the first row first column light-emitting unit UT11 and contacts of connection wirings connected to the second row second column light-emitting unit UT22 may be arranged in a symmetric manner with each other in an axis parallel to the second direction DR2. Further, contacts of connection wirings connected to the first row second column light-emitting unit UT12 and contacts of connection wirings connected to the second row first column light-emitting unit UT21 may be arranged in a symmetric manner with each other in an axis parallel to the second direction DR2.

Hereinafter, the first row first column light-emitting unit UT11 will be described. In FIG. 4B, for convenience of illustration, the second electrodes EL2_1, EL2_2, and EL2_3, the pixel drivers PDC, and the connection wirings CN are shown. The second electrodes EL2_1, EL2_2, and EL2_3 may be isolated from each other via the separator SPR. In this embodiment, one light-emitting unit UT may include three light-emitting areas EP1, EP2 and EP3. Accordingly, the light-emitting unit UT may include the three second electrodes EL2_1, EL2_2, and EL2_3 (hereinafter, first to third cathodes), three pixel drivers PDC1a, PDC1b, PDC2a, PDC2b, PDC3a and PDC3b, and three connection wirings CN1, CN2, and CN3. However, this is shown by way of example, and the number and arrangement of the light-emitting units UT may be designed in various ways. The disclosure is not limited thereto. FIG. 4B may further include light emitting connected portions CE1a, CE1b, CE2a, CE2b, CE3a and CE3b. It is also noted that FIG. 4B may also further include driving connection portions CD1a, CD1b, CD2a, CD2b, CD3a, and CD3b. FIG. 4B may also include EL2_1a, EL2_1b, EL2_2a, EL2_2b, EL2_3a and EL2_3b.

Each of the first to third pixel drivers PDC1a, PDC1b, PDC2a, PDC2b, PDC3a and PDC3b may be electrically connected to each of the first to third light-emitting elements of the first to third light-emitting areas EP1, EP2, and EP3.

The first to third pixel drivers PDC1a, PDC1b, PDC2a, PDC2b, PDC3a and PDC3b may be sequentially arranged along the first direction DR1. In one example, positions of the first to third pixel drivers PDC1a, PDC1b, PDC2a, PDC2b, PDC3a and PDC3b may be independently designed regardless of positions and/or area shapes of the first to third light-emitting areas EP1, EP2, and EP3.

For example, each of the first to third pixel drivers PDC1a, PDC1b, PDC2a, PDC2b, PDC3a and PDC3b may be disposed in a different location from each of areas defined by the separators SPR, that is, from each of positions where the first to third cathodes EL2_1, EL2_2, and EL2_3 are positioned. Each of the first to third pixel drivers PDC1, PDC2, and PDC3 may be designed to have an area shape different from that of each of the first to third cathodes EL2_1, EL2_2, and EL2_3. In other embodiments, each of the first to third pixel drivers PDC1a, PDC1b, PDC2a, PDC2b, PDC3a and PDC3b may be positioned so as to overlap each of the areas in which the first to third light-emitting areas EP1, EP2, and EP3 are positioned. Each of the first to third pixel drivers PDC1a, PDC1b, PDC2a, PDC2b, PDC3a and PDC3b may be designed to have an area shape similar to a shape of each of areas defined by the separator SPR, for example, an area shape of each of the first to third cathodes EL2_1, EL2_2, and EL2_3.

In this embodiment, each of the first to third pixel drivers PDC1a, PDC1b, PDC2a, PDC2b, PDC3a and PDC3b is shown as having a rectangular shape, and each of the first to third light-emitting areas EP1, EP2, and EP3 is shown as having a smaller area than an area of the rectangular shape and a different shape from the rectangular shape. Further, each of the first to third cathodes EL2_1, EL2_2, and EL2_3 is illustrated as being positioned as to overlap each of the first to third light-emitting areas EP1, EP2, and EP3, and is shown as having an irregular shape.

Accordingly, as shown in FIG. 4B, the first pixel driver PDC1a or PDC1b may be positioned so as to partially overlap the first light-emitting area EP1, the second light-emitting area EP2, and another light-emitting unit adjacent thereto. The second pixel driver PDC2 may be positioned so as to partially overlap the first light-emitting area EP1, the second light-emitting area EP2, and the third light-emitting area EP3. The third pixel driver PDC3 may be positioned so as to partially overlap the third light-emitting area EP3. This is shown by way of example, and the position of each of the first to third pixel drivers PDC1a, PDC1b, PDC2a, PDC2b, PDC3a and PDC3b may be designed in various manners independently of the first to third light-emitting areas EP1, EP2, and EP3. The disclosure is not limited thereto.

The connection wiring CN may include multiple connection wirings which may be spaced apart from each other. Each of the connection wirings CN may connect each of the first to third pixel drivers to each of the first to third light-emitting elements. Specifically, the connection wiring may correspond to a node (N4 in FIG. 2A or N3 in FIG. 2B) where the light-emitting element LD (FIG. 5) is connected to the pixel driver PDC.

The connection wiring may include a first contact CE (hereinafter, a light-emitting contact) and a second contact CD (hereinafter, a driving contact). The light-emitting contact CE may be provided at an end of the connection wiring CN while the driving contact CD may be provided at another end of the connection wiring CN.

The driving contact CD may refer to a portion of the connection wiring CN connected to the pixel driver PDC. In this embodiment, the driving contact CD may be connected to one electrode of a transistor constituting the pixel driver PDC. Specifically, the driving contact CD may be connected to a drain of the sixth transistor T6 as shown in FIG. 2A or a drain of the first transistor T1 as shown in FIG. 2B. Accordingly, a location of the driving contact CD may correspond to a location of a transistor TR (FIG. 5) of the pixel driver PDC physically connected to the connection wiring CN. The light-emitting contact CE may refer to a portion of the connection wiring CN connected to the light-emitting element. In this embodiment, the light-emitting contact CE may be connected to the second electrode EL2 (FIG. 5) (hereinafter, a cathode) of the light-emitting element.

The light-emitting unit UT may include the first to third connection wirings CN1, CN2, and CN3. The first connection wiring CN1 may connect the first light-emitting element constituting the first light-emitting area EP1 to the first pixel driver PDC1a or PDC1b. The second connection wiring CN2 may connect the second light-emitting element constituting the second light-emitting area EP2 to the second pixel driver PDC2. The third connection wiring CN3 may connect the third light-emitting element constituting the third light-emitting area EP3 to the third pixel driver PDC3.

Specifically, the first to third connection wirings CN1, CN2, and CN3 may connect the first to third cathodes EL2_1, EL2_2, and EL2_3 to the first to third pixel drivers PDC1a, PDC1b, PDC2a, PDC2b, PDC3a and PDC3b, respectively. The first connection wiring CN1 may include the first driving contact CD1 connected to the first pixel driver PDC1a or PDC2a and the first light-emitting contact CE1 connected to the first cathode EL2_1. The second connection wiring CN2 may include the second driving contact CD2 connected to the second pixel driver PDC2 and the second light-emitting contact CE2 connected to the second cathode EL2_2. The third connection wiring CN3 may include the third driving contact CD3 connected to the third pixel driver PDC3 and the third light-emitting contact CE3 connected to the third cathode EL2_3.

The first to third driving contacts CD1, CD2, and CD3 may be aligned along the first direction DR1. As described above, the positions of the first to third driving contacts CD1, CD2, and CD3 may respectively correspond to positions of connection transistors constituting the first to third pixel drivers PDC1a, PDC1b, PDC2a, PDC2b, PDC3a and PDC3b, respectively. The connection transistor may be a transistor including a connection node at which a pixel driver and a light-emitting element in one pixel are connected to each other as one electrode. For example, the connection transistor may correspond to the sixth transistor T6 in FIG. 2A or the first transistor T1 in FIG. 2B. According to the disclosure, regardless of shapes, sizes, or light-emitting colors of the light-emitting areas, the pixel drivers of all pixels may be designed in the same manner. Thus, a process may be simplified, and a cost may be reduced.

Figure 5:
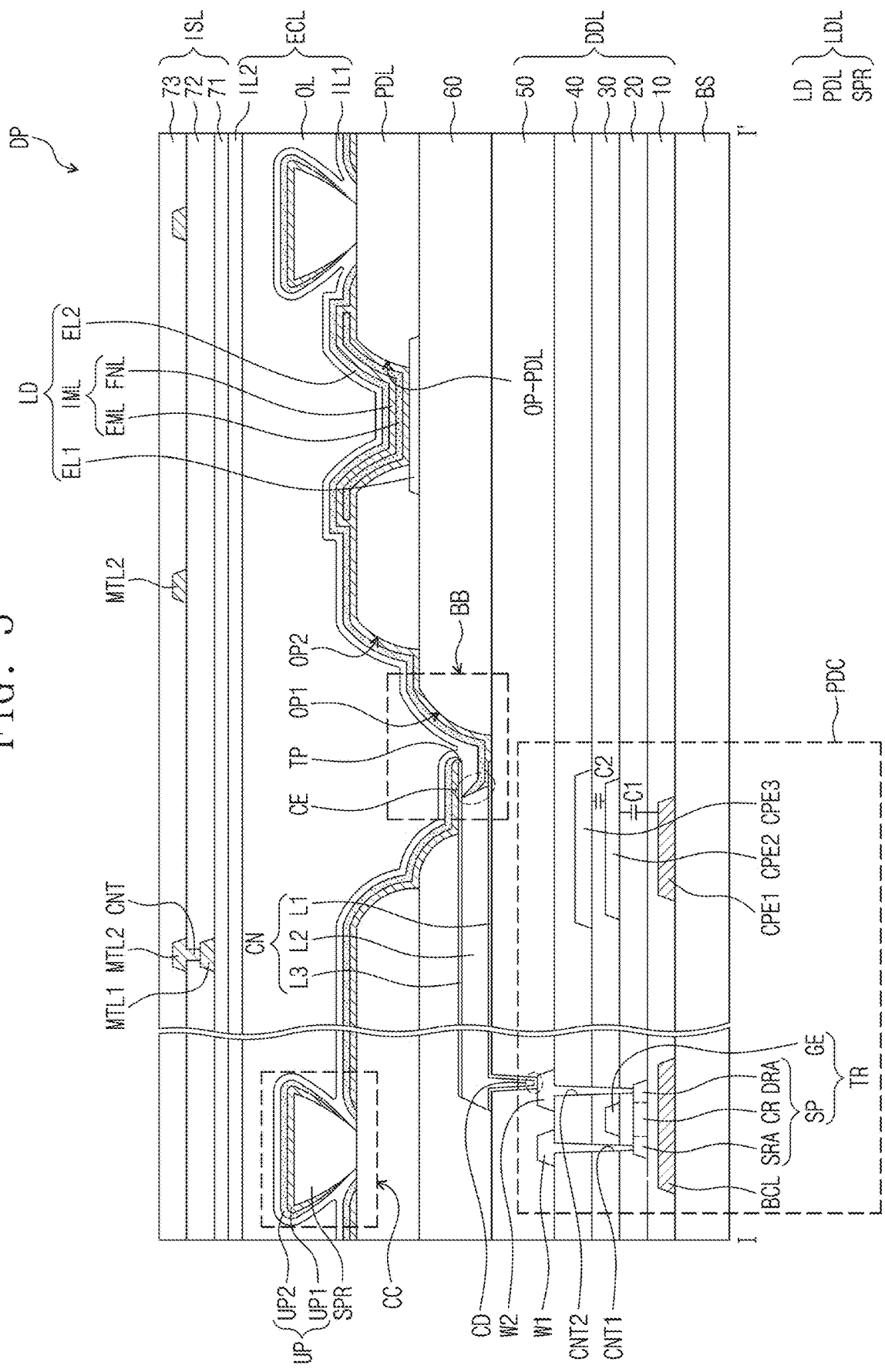
FIG. 5 is a schematic cross-sectional view of a display panel according to an embodiment.

In this embodiment, the first to third light-emitting contacts CE1, CE2, and CE3 may be defined at non-overlapping positions respectively with the light-emitting areas EP1, EP2, and EP3 in a plan view. As described above, each of the light-emitting contacts CE1, CE2, and CE3 may be a portion of the connection wiring CN connected to the light-emitting element LD (FIG. 5). Further, each of the first to third light-emitting contacts CE1, CE2, and CE3 may belong to an area in which a tip TP (FIG. 5) as described below is defined. Thus, each of the first to third light-emitting contacts CE1, CE2, and CE3 may not overlap the light-emitting opening OP-PDL (FIG. 5). For example, each of the first to third light-emitting contacts CE1, CE2, and CE3 may be located at a position in each of the first to third cathodes EL2_1, EL2_2, and EL2_3 so as to be spaced from each of the first to third light-emitting areas EP1, EP2, and EP3. Each of the first to third cathodes EL2_1, EL2_2, and EL2_3 may include a partial area protruding from each of the light-emitting areas EP1, EP2, and EP3 in the plan view such that each of the first to third cathodes EL2_1, EL2_2, and EL2_3 is connected to each of the connection wirings CN1, CN2, and CN3 at each location where each of the first to third light-emitting contacts CE1, CE2, and CE3 is disposed.

For example, the first cathode EL2_1 may include a protruding area protruding from the first light-emitting area EP1 at a position that does not overlap the first light-emitting area EP1 such that the first cathode EL2_1 is connected to the first connection wiring CN1 at a position at which the first light-emitting contact CE1 is disposed. The first light-emitting contact CE1 may be disposed in the protruding area. Accordingly, the first light-emitting contact CE1 that may be connected to the first connection wiring CN1 may be provided without reducing the light-emitting area of the first light-emitting area EP1.

As described above, the connection wiring CN may include the light-emitting contact CE and the driving contact CD. The first pixel driver PDC1a or PDC1b, in particular, the first driving contact CD1 at which the first connection wiring CN1 is connected to the transistor TR may be defined at a location that does not overlap the first light-emitting area EP1 in the plan view. According to the disclosure, the first connection wiring CN1 may be disposed in the first light-emitting area EP1, so that the first cathode EL2_1 and the first pixel driver PDC1a or PDC2b spaced apart from each other may be readily connected to each other.

The third pixel driver PDC3, in particular, the third driving contact CD3 contacting the connection transistor TR may be defined at a position that does not overlap the third light-emitting contact CE3 in a plan view, and may be disposed at an overlapping position with the third light-emitting area EP3. According to an embodiment, the third cathode EL2_3 and the third pixel driver PDC3 may be connected to each other via the third connection wiring CN3. Thus, even in case that a position of the third driving contact CD3 overlaps the third light-emitting area EP3 in a plan view, the connection between the third pixel driver PDC3 and the third cathode EL2_3 may be readily made. Therefore, in a design of the third pixel driver PDC3, limitation in terms of a location or a shape of the third light-emitting area EP3 may be reduced, so that a degree of freedom of design of a circuit may be improved.

Referring back to FIG. 4A, the light-emitting areas of the second row Rk+1 may constitute the second row first column light-emitting units UT21 and the second row second column light-emitting units UT22 which are repeatedly arranged. In this regard, the light-emitting areas constituting the first row first column light-emitting unit UT11 and the light-emitting areas constituting the second row first column light-emitting unit UT21 may be arranged in a symmetric manner with each other in an axis parallel to the second direction DR2. The light-emitting areas constituting the first row second column light-emitting unit UT12 and the light-emitting areas constituting the second row second column light-emitting unit UT22 may be arranged in a symmetric manner with each other in an axis parallel to the second direction DR2. Thus, each of the light-emitting units UT21 and UT22 of the second row may be composed of light-emitting areas to which the light-emitting areas of each of the first row light-emitting units UT11 and UT12 are substantially shifted in the second direction DR2. For example, the second row first column light-emitting unit UT21 may be composed of light-emitting areas having the same shapes respectively as those of the light-emitting areas of the first row second column light-emitting unit UT12. The second row second column light-emitting unit UT22 may be composed of light-emitting areas having the same shapes respectively as those of the light-emitting areas of the first row first column light-emitting unit UT11.

Accordingly, the shapes and arrangement of the connection wirings CN-c connected to the second row first column light-emitting unit UT21 may be the same as the shapes and arrangement of the connection wirings CN1$b$, CN2$b$, and CN3$b$ connected to the first row second column light-emitting unit UT12. Similarly, the shapes and arrangement of the connection wirings CN-d connected to the second row second column light-emitting unit UT22 may be the same as the shapes and arrangement of the connection wirings CN1$a$, CN2$a$, and CN3$a$ connected to the first row first column light-emitting unit UT11.

In one example, referring to FIG. 4C, the first electrode EL1, (hereinafter, an anode) of the light-emitting element according to an embodiment of the disclosure may commonly belong to the light-emitting areas EP1, EP2, and EP3. For example, the anode EL1 may be provided in an integral structure and may overlap the light-emitting areas or the separator SPR. As described above, the first driving voltage VDD (FIG. 1) may be applied to the anode EL1, and a common voltage may be provided to all light-emitting areas. The anode EL1 may be connected to the first driving voltage line VDL (FIG. 2A) providing the first driving voltage VDD in the peripheral area NDA (FIG. 3A or FIG. 3B) or may be connected to the first driving voltage line VDL in the display area DA. However, the disclosure is not limited thereto.

In one example, multiple openings OP-EL1 may be defined in the anode EL1 according to this embodiment, and the openings OP-EL1 may extend through the anode EL1. The openings OP-EL1 may be disposed at non-overlapping locations with the light-emitting areas. The openings may be defined at positions overlapping the separator SPR. The openings OP-EL1 may facilitate discharge of gas generated from an organic layer disposed below the anode EL1, for example, from a sixth insulating layer 60 (FIG. 5) to be described later. Accordingly, in a manufacturing process of the display panel DP, the gas from the organic layer disposed below the light-emitting element may be sufficiently discharged. Thus, the deterioration of the light-emitting element LD due to the gas discharged from the organic layer may be lowered.

According to the disclosure, unlike a conventional light-emitting area in which a connection transistor of a corresponding pixel driver and cathode overlap each other in a plan view, the light-emitting area including the cathode non-overlapping the connection transistor of the pixel driver may further include the connection wiring. Thus, the light-emitting element may be readily connected to the pixel driver via the connection wiring. According to the disclosure, the light-emitting area may further include the connection wiring. Thus, the light-emitting element may be stably connected to the pixel driver via the connection wiring while only a shape of the cathode is changed without changing a design of the light-emitting area. Accordingly, an effect of the arrangement or the shape of the light-emitting area on the connection between the light-emitting element and the pixel driver may be reduced, so that the degree of freedom in design on an arrangement of the pixel driver may be improved and an aperture ratio of the light-emitting area may be prevented from being lowered.

Figure 6A:
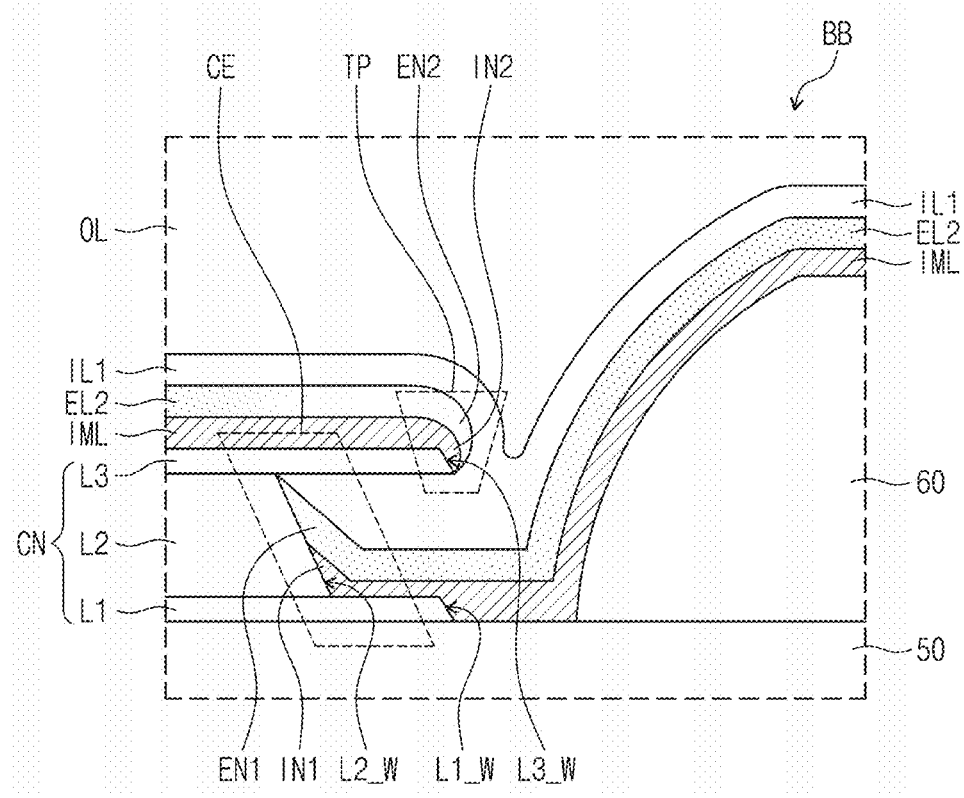
FIG. 6A is a schematic plan view showing area BB as shown in FIG. 5.
Figure 6B:
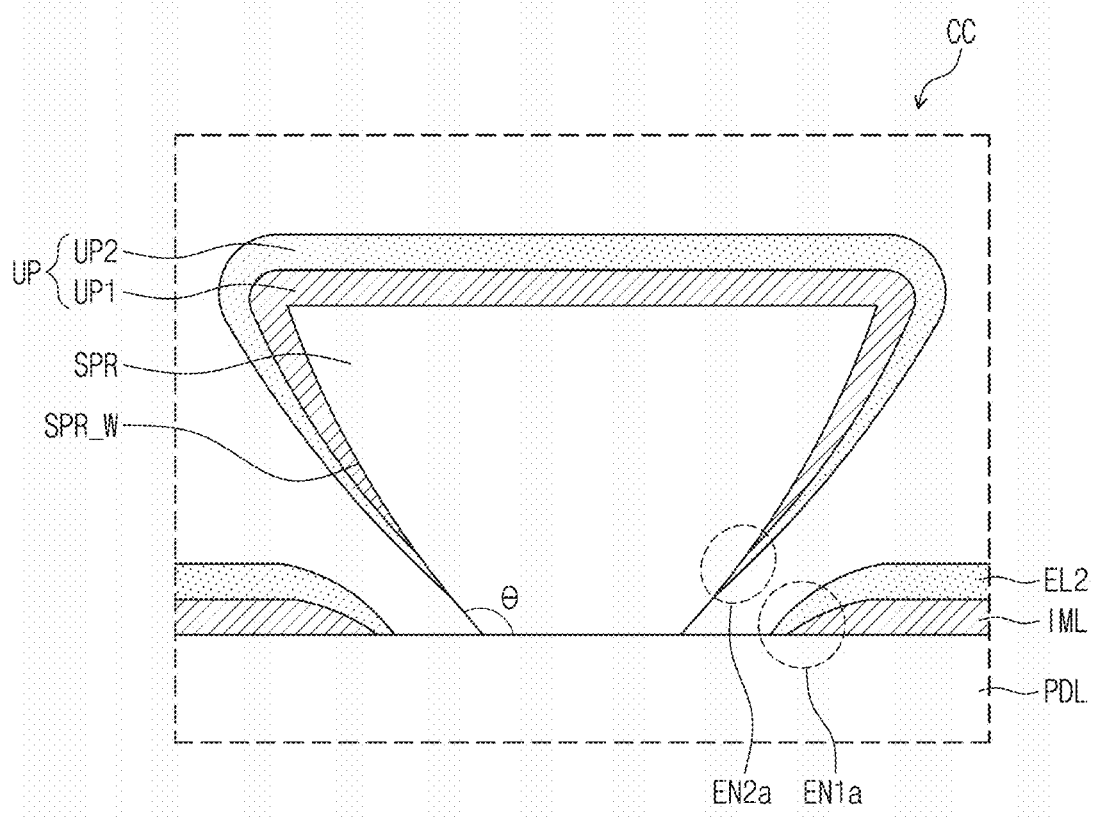
FIG. 6B is a schematic plan view showing area CC as shown in FIG. 5.

FIG. 5 is a schematic cross-sectional view of a display panel according to an embodiment. FIG. 6A is a schematic plan view showing area BB as shown in FIG. 5. FIG. 6B is a schematic plan view showing area CC as shown in FIG. 5.

FIG. 5 shows a cross-sectional view showing a portion corresponding to a line I-I' of FIG. 4B. Hereinafter, the disclosure will be described with reference to FIG. 5 to FIG. 6B.

Referring to FIG. 5, the display panel DP of an embodiment may include a base layer BS, a driving element layer DDL, the sixth insulating layer 60, a light-emitting element layer LDL, and a sensing layer ISL. The driving element layer DDL may include multiple insulating layers 10, 20, 30, 40, and 50 disposed on the base layer BS, and multiple conductive patterns and semiconductor patterns disposed between the insulating layers. The conductive patterns and the semiconductor patterns may be disposed between the insulating layers so as to constitute the pixel driver PDC and the connection wiring CN. FIG. 5 shows a cross-section of a portion of an area in which one of the first to third light-emitting areas is disposed for convenience of illustration.

The base layer BS may be a member providing a base face on which the pixel driver PDC is disposed. The base layer BS may be a rigid substrate or a flexible substrate capable of being bent, folded, and/or rolled. The base layer BS may be a glass substrate, a metal substrate, and/or a polymer substrate. However, the disclosure is not limited thereto, and the base layer BS may be an inorganic layer, an organic layer, or a composite material layer.

The base layer BS may have a multilayer structure. The base layer BS may include a first polymer resin layer, a silicon oxide (SiOx) layer disposed on the first polymer resin layer, an amorphous silicon (a-Si) layer disposed on the silicon oxide layer, and a second polymer resin layer disposed on the amorphous silicon layer. The silicon oxide layer and the amorphous silicon layer may be referred to as a base barrier layer.

Each of the first and second polymer resin layers may include a polyimide-based resin. Further, each of the first and second polymer resin layers may include at least one of acrylate-based resin, methacrylate-based resin, polyisoprene-based resin, vinyl-based resin, epoxy-based resin, urethane-based resin, cellulose-based resin, siloxane-based resin, polyamide-based resin, and/or perylene-based resin. As used herein, "~based" resin means a resin including a functional group of "~".

In the display panel DP, each of the insulating layers or the conductive layers and the semiconductor layers disposed on the base layer BS may be formed using a scheme such as coating or deposition. Thereafter, the organic layer, the inorganic layer, the semiconductor layer, and the conductive layer may be selectively patterned using photolithography processes to form a hole in the insulating layer or to form the semiconductor pattern, the conductive pattern, and a signal line.

The driving element layer DDL may include the first to fifth insulating layers 10, 20, 30, 40, and 50 sequentially stacked on each other on the base layer BS and the pixel driver PDC. FIG. 5 shows one transistor TR and two capacitors C1 and C2 of the pixel driver PDC. The transistor TR may correspond to a transistor connected to the light-emitting element LD via the connection wiring CN, that is, the connection transistor connected to the node (the fourth node N4 in FIG. 2A or the second node N2 in FIG. 2B) corresponding to the cathode of the light-emitting element LD. Specifically, the transistor TR may correspond to the sixth transistor T6 of FIG. 2A or the first transistor T1 of FIG. 2B. In one example, although not shown, each of other transistors constituting the pixel driver PDC may have the same structure as that of the transistor TR (hereinafter, the connection transistor) as shown in FIG. 5. However, this is described by way of example, and each of the other transistors constituting the pixel driver PDC may have a structure different from that of the connection transistor TR. The disclosure is not limited thereto.

The first insulating layer 10 may be disposed on the base layer BS. The first insulating layer 10 may be an inorganic layer and/or an organic layer, and may have a single-layer or multi-layer structure. The first insulating layer 10 may include at least one of aluminum oxide, titanium oxide, silicon oxide, silicon nitride, silicon oxynitride, zirconium oxide, and hafnium oxide. In this embodiment, the first insulating layer 10 may be a single layer made of silicon oxide. In one example, each of the insulating layers as described later may be an inorganic layer and/or an organic layer and may have a single-layer or multi-layer structure. The inorganic layer may include at least one of the above materials. However, the disclosure is not limited thereto.

In one example, the first insulating layer 10 may cover a lower conductive layer BCL. For example, the display panel DP may further include the lower conductive layer BCL disposed below the connection transistor TR so as to overlap the connection transistor TR. The lower conductive layer BCL may prevent an electric potential due to a polarization phenomenon of the base layer BS from affecting the connection transistor TR. Further, the lower conductive layer BCL may prevent light incident from a position below the lower conductive layer BCL from being incident to the connection transistor TR. At least one of an inorganic barrier layer and a buffer layer may be further disposed between the lower conductive layer BCL and the base layer BS.

The lower conductive layer BCL may include a reflective metal. For example, the lower conductive layer BCL may include titanium (Ti), molybdenum (Mo), an alloy containing molybdenum, aluminum (Al), an alloy containing aluminum, aluminum nitride (AlN), tungsten (W), tungsten nitride (WN), or copper (Cu).

In this embodiment, the lower conductive layer BCL may be connected to a source of the transistor TR via a source electrode pattern W1. The lower conductive layer BCL may be synchronized with the source of the transistor TR. However, this is shown by way of example, and the lower conductive layer BCL may be connected to a gate of the transistor TR and may be synchronized with the gate thereof. In other embodiments, the lower conductive layer BCL may be connected to another electrode to receive a constant voltage or a pulse signal independently therefrom. In other embodiments, the lower conductive layer BCL may be provided in an isolated form from another conductive pattern. In this regard, the source electrode pattern W1, etc. may be omitted. The lower conductive layer BCL according to an embodiment of the disclosure may be provided in various forms. The disclosure is not limited thereto.

The connection transistor TR may be disposed on the first insulating layer 10. The connection transistor TR may include a semiconductor pattern SP and a gate electrode GE. The semiconductor pattern SP may be disposed on the first insulating layer 10. The semiconductor pattern SP may include an oxide semiconductor. For example, an oxide semiconductor may include a transparent conductive oxide (TCO) such as indium tin oxide (ITO), indium zinc oxide (IZO), indium gallium zinc oxide (IGZO), zinc oxide (ZnO) and/or indium oxide ($In_2O_3$). However, the disclosure is not limited thereto, and the semiconductor pattern may include amorphous silicon, low-temperature polycrystalline silicon, and/or polycrystalline silicon.

The second insulating layer 20 may commonly overlap the pixels and may cover the semiconductor pattern SP. The second insulating layer 20 may be an inorganic layer and/or an organic layer, and may have a single-layer or multi-layer structure. The second insulating layer 20 may include at least one of aluminum oxide, titanium oxide, silicon oxide, silicon nitride, silicon oxynitride, zirconium oxide, and hafnium oxide. In this embodiment, the second insulating layer 20 may be a single layer made of silicon oxide.

The semiconductor pattern SP may include a source area SRA, a drain area DRA, and a channel area CR (or a channel) distinguished from each other based on a conductivity level. The channel area CR may be a portion overlapping the gate electrode GE in a plan view. The source area SRA and the drain area DRA may be spaced apart while the channel area CR is interposed therebetween. In case that the semiconductor pattern SP is made of an oxide semiconductor, each of the source area SRA and the drain area DRA may be a reduced area. Accordingly, each of the source area SRA and the drain area DRA has a relatively high content of a reduced metal compared to that in the channel area CR. In other embodiments, in case that the semiconductor pattern SP is made of polycrystalline silicon, each of the source area SRA and the drain area DRA may be an area doped with impurities at a high concentration.

Each of the source area SRA and the drain area DRA may have relatively higher conductivity than that of the channel area CR. The source area SRA may correspond to the source electrode of the connection transistor TR and the drain area DRA may correspond to the drain electrode of the connection transistor TR. As shown in FIG. 5, a separate source electrode pattern and a separate drain electrode pattern respectively connected to the source area SRA and the drain area DRA may be further provided. Specifically, each of the separate source electrode pattern and the separate drain electrode pattern may be integrally formed with one of lines constituting the pixel driver. The disclosure is not limited thereto.

The gate electrode GE is disposed on the second insulating layer 20. The gate electrode GE may correspond to the gate of the connection transistor TR.

The gate electrode GE may be disposed on the semiconductor pattern SP. However, this is shown by way of example, and the gate electrode GE may be disposed below the semiconductor pattern SP. The disclosure is not limited thereto.

The gate electrode GE may include titanium (Ti), silver (Ag), molybdenum (Mo), aluminum (Al), aluminum nitride (AlN), tungsten (W), tungsten nitride (WN), copper (Cu), and/or alloys thereof, etc. However, this is merely an example, and the disclosure is not limited thereto.

A first capacitor electrode CPE1 and a second capacitor electrode CPE2 among multiple conductive patterns W1, W2, CPE1, CPE2, and CPE3 may constitute the first capacitor C1. The first capacitor electrode CPE1 and the second capacitor electrode CPE2 may be spaced apart from each other while the first insulating layer 10 and the second insulating layer 20 are interposed therebetween.

The first capacitor electrode CPE1 and the lower conductive layer BCL may have an integral structure with each other. Further, the second capacitor electrode CPE2 and the gate electrode GE may have an integral structure with each other.

The third capacitor electrode CPE3 may be disposed on the third insulating layer 30. The third capacitor electrode CPE3 may be spaced apart from the second capacitor electrode CPE2 while the third insulating layer 30 is disposed therebetween, and may overlap the second capacitor electrode CPE2 in a plan view. The third capacitor electrode CPE3 and the second capacitor electrode CPE2 may constitute the second capacitor C2.

The fourth insulating layer 40 may be disposed on the third capacitor electrode CPE3.

The source electrode pattern W1 and the drain electrode pattern W2 may be disposed on the fourth insulating layer 40. The source electrode pattern W1 may be connected to the source area SRA of the connection transistor TR via a first through-hole CNT1. The source electrode pattern W1 and the source area SRA of the semiconductor pattern SP may function as a source of the connection transistor TR. The drain electrode pattern W2 may be connected to the drain area DRA of the connection transistor TR via a second contact hole CNT2. The drain electrode pattern W2 and the drain area DRA of the semiconductor pattern SP may function as a drain of the connection transistor TR.

The fifth insulating layer 50 may be disposed on the source electrode pattern W1 and the drain electrode pattern W2.

The connection wiring CN may be disposed on the fifth insulating layer 50. The connection wiring CN may connect the connection transistor TR and the light-emitting element LD to each other. For example, the connection wiring CN may correspond to the fourth node N4 as shown in FIG. 2A or the second node N2 as shown in FIG. 2B. However, this is merely an example. As long as the connection wiring CN may be connected to the light-emitting element LD, the connection wiring CN may be defined as a connection node with each of various elements among elements constituting the pixel driver PDC according to a design of the pixel driver PDC. The disclosure is not limited thereto.

In one example, the sixth insulating layer 60 may be disposed between the driving element layer DDL and the light-emitting element layer LDL. The sixth insulating layer 60 may be disposed on the fifth insulating layer 50 so as to cover the connection wiring CN. Each of the fifth insulating layer 50 and the sixth insulating layer 60 may be an organic layer. For example, each of the fifth insulating layer 50 and the sixth insulating layer 60 may include a general-purpose polymer such as BCB (Benzocyclobutene), polyimide, HMDSO (Hexamethyldisiloxane), Polymethylmethacrylate (PMMA), and/or polystyrene (PS), a polymer derivative having a phenolic group, an acrylate-based polymer, an imide-based polymer, an arylether-based polymer, an amide-based polymer, a fluorine-based polymer, a p-xylene-based polymer, a vinyl alcohol-based polymer, or blends thereof.

An opening exposing at least a portion of the connection wiring CN may be defined in the sixth insulating layer 60. The connection wiring CN may be electrically connected to the light-emitting element LD via a portion thereof exposed through the opening defined in the sixth insulating layer 60. For example, the connection wiring CN may electrically connect the connection transistor TR and the light-emitting element LD to each other. This will be described below in detail.

The light-emitting element layer LDL may be disposed on the sixth insulating layer 60. The light-emitting element layer LDL may include a pixel defining film PDL, the light-emitting element LD, an encapsulation layer ECL, and the separator SPR. In one example, in the display panel DP according to an embodiment of the disclosure, the sixth insulating layer 60 may be omitted or may include multiple layers. The disclosure is not limited thereto.

The pixel defining film PDL may be an organic layer. For example, the pixel defining film PDL may include a general-purpose polymer such as BCB (Benzocyclobutene), polyimide, HMDSO (Hexamethyldisiloxane), Polymethylmethacrylate (PMMA), and/or polystyrene (PS), a polymer derivative having a phenolic group, an acrylate-based polymer, an imide-based polymer, an arylether-based polymer, an amide-based polymer, a fluorine-based polymer, a p-xylene-based polymer, a vinyl alcohol-based polymer, or blends thereof.

The pixel defining film PDL may have a property of absorbing light. For example, the pixel defining film PDL may have a black color. The pixel defining film PDL may include a black coloring agent. The black coloring agent may include black dyes and black pigments. The black coloring agent may include carbon black, a metal such as chromium, and/or an oxide thereof. The pixel defining film PDL may act as a light blocking pattern having light blocking properties.

An opening OP-PDL (hereinafter, a light-emitting opening) may be defined in the pixel defining film PDL so as to extend through the pixel defining film PDL. Multiple light-emitting openings OP-PDL may be disposed in a corresponding manner to the light-emitting elements, respectively. All components of the light-emitting element LD may be disposed in the light-emitting opening OP-PDL so as to overlap each other. The light-emitting opening OP-PDL may be an area in which light emitted from the light-emitting element LD is substantially emitted. Accordingly, a shape of the above-described light-emitting area EP (FIG. 3A) may substantially correspond to a shape of the light-emitting opening OP-PDL in a plan view.

The light-emitting element LD may include an organic light-emitting material, an inorganic light-emitting material, an organic-inorganic light-emitting material, a quantum dot, a quantum rod, a micro LED, and/or a nano LED.

The light-emitting element LD may include the first electrode EL1, a middle layer IML, and the second electrode EL2. The first electrode EL1 may be a transmissive, transflective, or reflective electrode. In an embodiment, the first electrode EL1 may include a reflective layer made of silver, magnesium, aluminum, platinum, palladium, gold, nickel, neodymium, iridium, chromium, or a compound thereof, and a transmissive or transflective electrode layer formed on the reflective layer. The transmissive or transflective electrode layer may include at least one selected from a group consisting of indium tin oxide (ITO), indium zinc oxide (IZO), indium gallium zinc oxide (IGZO), zinc oxide (ZnO) or indium oxide ($In_2O_3$), and aluminum doped zinc oxide (AZO). For example, the first electrode EL1 may include a stacked structure of ITO/Ag/ITO.

In this embodiment, the first electrode EL1 may be an anode of the light-emitting element LD. For example, the first electrode EL1 may be connected to the first power line VDL (FIG. 2A) and the first power voltage VDD (FIG. 2A) may be applied thereto. The first electrode EL1 may be connected to the first power line VDL in the display area DA or may be connected to the first power line VDL in the peripheral area NDA. In the latter case in which, in the peripheral area NDA, the first electrode EL1 is connected to the first power line VDL, the first power line VDL may be disposed in the peripheral area NDA, and the first electrode EL1 may have a shape extending to the peripheral area NDA.

In this embodiment, it is illustrated that the first electrode EL1 overlaps the light-emitting opening OP-PDL and not overlap the separator SPR. However, the disclosure is not limited thereto. As described above, the first electrodes EL1 of the pixels may have an integral structure with each other and may have a mesh or grid shape in which the openings are defined in a partial area thereof, as shown in FIG. 4C. For example, as long as the same first power voltage VDD may be applied to the first electrodes EL1 of the light-emitting elements, the shape of the first electrode EL1 may be provided in various ways. The disclosure is not limited thereto.

The middle layer IML may be disposed between the first electrode EL1 and the second electrode EL2. The middle layer IML may include a light-emitting layer EML and a function layer FNL. However, this is merely an example, and the light-emitting element LD may include the middle layer IML of each of various structures. The disclosure is not limited thereto. For example, the function layer FNL may be embodied as multiple layers or as two or more layers spaced apart from each other while the light-emitting layer EML is interposed therebetween. In other embodiments, the function layer FNL may be omitted.

The light-emitting layer EML may absorb energy corresponding to a difference between potentials of the first electrode EL1 and the second electrode EL2 to emit light. The light-emitting layer EML is shown as including an organic light-emitting material. However, the disclosure is not limited thereto, and the light-emitting layer EML may include an inorganic light-emitting material or may be provided as a layer of a mixture of an organic light-emitting material and an inorganic light-emitting material.

The light-emitting layer EML may be disposed so as to overlap the light-emitting opening OP-PDL. In this embodiment, the light-emitting layers EML of the different pixels may be separate from each other. In case that the light-emitting layers EML of the different light-emitting areas EP are separate from each other, the light-emitting layer EML may emit light of at least one color of blue, red, and green. However, the disclosure is not limited thereto, and the light-emitting layer EML may have an integral structure commonly belonging to adjacent light-emitting areas EP. The light-emitting layer EML may provide blue light or white light. In one example, the light-emitting layer EML may have the same shape as that of the function layer FNL. The middle layer IML may have a structure in which the function layer FNL and the light-emitting layer EML may be integral with each other.

The function layer FNL may be disposed between the first electrode EL1 and the second electrode EL2. The function layer FNL may be disposed between the first electrode EL1 and the light-emitting layer EML, or may be disposed between the light-emitting layer EML and the second electrode EL2. In other embodiments, the function layer FNL may be disposed between the first electrode EL1 and the light-emitting layer EML and between the second electrode EL2 and the light-emitting layer EML. In this embodiment, the light-emitting layer EML is shown as being received in the function layer FNL. However, the disclosure is not limited thereto. The function layer FNL may include a layer disposed between the light-emitting layer EML and the first electrode EL1 and/or a layer disposed between the light-emitting layer EML and the second electrode EL2, wherein each of the layers may include multiple layers. The disclosure is not limited thereto.

The function layer FNL may control transfer of electric charges. The function layer FNL may include a hole injection/transport material and/or an electron injection/transport material. The function layer FNL may include at least one of an electronic blocking layer, a hole transporting layer, a hole injection layer, a hole blocking layer, an electron transporting layer, an electron injection layer, and an electric charge generating layer.

The second electrode EL2 may be disposed on the middle layer IML. As described above, the second electrode EL2 may be connected to the pixel driver PDC via the third node (ND3 in FIG. 2A or N3 in FIG. 2B). In this embodiment, the second electrode EL2 may be electrically connected to the connection transistor TR via the connection wiring CN.

Referring to FIG. 5, the connection wiring CN may include the driving contact CD, the light-emitting contact CE, and an extension CNL. Hereinafter, the connection wiring CN will be described with reference to FIG. 5 to FIG. 6B.

The driving contact CD may be a portion of the connection wiring CN connected to the pixel driver PDC and may be a portion thereof substantially connected to the connection transistor TR. In this embodiment, the driving contact CD may extend through the fifth insulating layer 50 and may be connected to the drain area DRA of the semiconductor pattern SP via the drain electrode pattern W2 of the transistor TR.

The light-emitting contact CE may be a portion of the connection wiring CN connected to the light-emitting element LD. The light-emitting contact CE may be defined in an area not covered with the sixth insulating layer 60 and may be a portion thereof directly connected to the second electrode EL2. In this regard, the tip TP may be defined in the light-emitting contact CE.

Referring to FIG. 5 and FIG. 6A, the connection wiring CN may include a structure in which three layers are stacked on each other. Specifically, the connection wiring CN may include a first layer L1, a second layer L2, and a third layer L3 stacked on each other along the third direction DR3. The first layer L1 may have a relatively smaller thickness compared to that of the second layer L2. For example, the first layer L1 may include titanium (Ti).

The second layer L2 may include a material different from that of the first layer L1. The second layer L2 may include a highly conductive material. For example, the second layer L2 may include aluminum (Al).

In one example, the second layer L2 may include a material having a higher etch rate than that of the first layer L1. A first side end L1_W of the first layer L1 may be defined outwardly of a second side end L2_W of the second layer L2. For example, the light-emitting contact CE of the connection wiring CN may have a shape in which the first side end L1_W of the first layer L1 is positioned outwardly beyond the second side end L2_W of the second layer L2.

The third layer L3 may include a material different from the material of the second layer L2. The third layer L3 may include a material having a lower etching rate than that of the second layer L2. For example, the third layer L3 may include titanium (Ti). A third side end L3_W of the third layer L3 may be defined outwardly of the second side end L2_W of the second layer L2. For example, the light-emitting contact CE of the connection wiring CN may have a shape in which the third side end L3_W of the third layer L3 is positioned outwardly beyond the second side end L2_W of the second layer L2. For example, the light-emitting contact CE of the connection wiring CN may have an undercut shape or an overhang structure. A portion of the third layer L3 positioned outwardly beyond the second side end L2_W of the second layer L2 may constitute the tip TP of the light-emitting contact CE.

The sixth insulating layer 60 and the pixel defining film PDL may not cover at least a portion of the tip TP. Specifically, a first opening OP1 exposing one side of the connection wiring CN at which the tip TP is defined may be defined in the sixth insulating layer 60, and a second opening OP2 overlapping the first opening OP1 may be defined in the pixel defining film PDL. An area size of the second opening OP2 may be at least the same as that of the first opening OP1 or may be larger than that of the first opening OP1.

The second electrode EL2 may also be disposed on a partial area of the sixth insulating layer 60 exposed through the second opening OP2 of the pixel defining film PDL. The second electrode EL2 may also be disposed on a top face of the sixth insulating layer 60 and a top face of the tip TP of the connection wiring CN exposed through the first opening OP1. In this regard, the second electrode EL2 may include an end EN1 disposed along a top face of the sixth insulating layer 60 and another end EN2 disposed on the top face of the tip TP of the connection wiring CN. An end EN1 and another end EN2 may be spaced from each other in an area where the light-emitting contact CE is defined. For example, the second electrode EL2 may be partially discontinuous at the tip TP, such that the end EN1 and the other end EN2 may be spaced from each other. An end EN1 may be formed along the second side end L2_W of the second layer L2, and may contact the second side end L2_W of the second layer L2, and may be disposed below the third layer L3. The other end EN2 may be discontinuous at an end of the third layer L3 and does not extend to a position below the third layer L3. In this example embodiment, the other end EN2 is shown as covering the third side end L3_W of the third layer L3. However, this is shown by way of example, and at least a portion of the third side end L3_W of the third layer L3 may not be covered with the other end EN2. According to the disclosure, the tip TP of the connection wiring CN may divide the second electrode EL2 into two spaced portions.

One of the two spaced portions may be in contact with the second layer L2 having a relatively high conductivity and thus be electrically connected to the light-emitting contact CE of the connection wiring CN.

In one example, the middle layer IML may be divided into two spaced portions IN1 and IN2 via the tip TP. The middle layer IML may include an end IN1 formed along a top face of the sixth insulating layer 60 and another end IN2 formed on the top face of the tip TP. In an area where the light-emitting contact CE is defined, an end IN1 and another end IN2 of the middle layer IML may be spaced from each other.

The end IN1 as one of the two spaced portions of the middle layer IML as present on an end EN1 of the second electrode EL2 may cover the first layer L1 and may contact the second layer L2, while another end IN2 as the other of the two spaced portions of the middle layer IML may be formed on another end EN2 of the second electrode EL2. In this regard, an end EN1 of the second electrode EL2 has a relatively larger contact area with the second side end L2_W of the second layer L2 than a contact area between the end IN1 of the middle layer IML and the second side end L2_W of the second layer L2. An entirety of a portion of the second side end L2_W of the second layer L2 not covered with the middle layer IML may be covered with the second electrode EL2. Thus, due to a difference in the deposition angle as described later, while the middle layer IML is discontinuous at the tip TP, a contact area between the middle layer IML and the second side end L2_W of the second layer L2 may be reduced as much as possible, and a contact area between the second electrode EL2 and the second side end L2_W of the second layer L2 may be maximized. Therefore, an amount by which the middle layer IML is received in the light-emitting contact CE may be reduced and the connection between the second electrode EL2 and the second layer L2 may be readily made. Therefore, while the second electrodes EL2 of the pixels are separated from each other, the second electrode EL2 may be stably connected to the connection wiring CN without a separate patterning process.

In one example, the display panel DP may include the separator SPR. The separator SPR may be disposed on the pixel defining film PDL. The second electrode EL2 and the middle layer IML may be commonly deposited across multiple pixels through an open mask. In this regard, the second electrodes EL2 may be isolated from each other via the separator SPR, and the middle layers IML may be isolated from each other via the separator SPR. As described above, the separator SPR may have a closed line shape in each of the light-emitting areas such that the light-emitting areas may be isolated from each other. Accordingly, the second electrode EL2 of one of the light-emitting areas may be isolated from the second electrode EL2 of each of the others of the light-emitting areas via the separator SPR. For example, the second electrode EL2 of one of adjacent pixels may be electrically isolated from the second electrode EL2 of the other of the adjacent pixels.

Referring to FIG. 5 and FIG. 6B, the separator SPR is described in more detail. FIG. 6B is an enlarged cross-sectional view of the separator SPR. The separator SPR may have a reverse taper shape. For example, an inner angle θ (hereinafter, a taper angle) defined between an outer face SPR_W of the separator SPR and the top face of the pixel defining film PDL may be an obtuse angle. However, this is shown by way of example. As long as the separator SPR divides the deposited layer such as the middle layer IML or the second electrode EL2 into spaced two portions, the taper angle θ may be set in various ways. The separator SPR may have the same structure as that of the tip TP. However, the disclosure is not limited thereto.

The separator SPR may include an organic material and thus may have insulating ability. The deposited layer, that is, each of the middle layer IML and the second electrode EL2 may be divided into spaced two portions via the separator SPR. Each of the middle layer IML and second electrode EL2 included in one light-emitting element may be separated from each of the middle layer IML and second electrode EL2 included in another light-emitting element adjacent thereto via the separator SPR. The deposited layer may have a first end EN1a and a second end EN2a due to the presence of the separator SPR. The first end EN1a may be spaced apart from the separator SPR and may be located on the pixel defining film PDL. The second end EN2a may be spaced from the first end EN1a so as to cover at least a portion of the outer face SPR_W of the separator SPR. In FIG. 6B, the first end EN1a is shown as being spaced from the outer face SPR_W of the separator SPR by a predefined spacing. However, the disclosure is not limited thereto. As long as the first end EN1a is isolated from the second end EN2a, the first end EN1a may contact the outer face SPR_W of the separator SPR.

In one example, the first end EN1a and the second end EN2a may be electrically isolated from each other. For example, even in case that the first end EN1a and the second end EN2a are not formed in the deposited layer and the deposited layer is physically continuous, a thickness of the second end EN2a formed along the outer face SPR_W of the separator SPR may be very thin, so that no electrical connection is made between a portion of the second end formed on the separator SPR and a portion of the first end adjacent thereto, it may be interpreted that the deposited layer is divided into two isolated portions via the separator SPR.

A dummy layer UP may be disposed on the separator SPR. The dummy layer UP may include a first dummy layer UP1 disposed on the separator SPR and a second dummy layer UP2 disposed on the first dummy layer UP1. The first dummy layer UP1 and the middle layer IML may be formed in the same process and may include the same material. The second dummy layer UP2 and the second electrode EL2 may be formed in the same process and may include the same material. For example, the first dummy layer UP1 and the second dummy layer UP2 may be formed in a manufacturing step of the middle layer IML and the second electrode EL2. In an embodiment of the disclosure, the dummy layer UP may be omitted.

According to the disclosure, even in case that there is no separate patterning process through a mask, the second electrode EL2 or the middle layer IML may not be formed on the outer face SPR_W of the separator SPR or may be formed to be very thin during a formation process of the second electrode EL2 and the middle layer IML. Thus, the second electrodes EL2 or the middle layers IML of the different pixels may be readily isolated from each other. However, this is shown by way of example. As long as the second electrodes EL2 or the middle layers IML of the different pixels are isolated from each other, the shape of the separator SPR may be changed in various ways. The disclosure is not limited thereto.

According to the disclosure, the display panel DP may include the connection wiring CN to achieve the electrical connection between the second electrode EL2 and the connection transistor TR. Further, according to the disclosure, the tip TP may be formed at the connection wiring CN, such that the second electrodes EL2 of the light-emitting areas may be readily isolated from each other without a separate patterning process. Further, via control of a deposition angle, the electrical connection between the second electrode EL2 and the connection wiring CN may be stably realized. Therefore, even in case that the second electrode EL2 connected to the pixel driver PDC is disposed above the first electrode EL1, the display panel DP in which the second electrode EL2 may be stably connected to the pixel driver PDC may be readily implemented.

Referring back to FIG. 5, the encapsulation layer ECL may be disposed on the pixel defining film PDL so as to cover the separator SPR. The encapsulation layer ECL may include a first inorganic layer IL1, an organic layer OL, and a second inorganic layer IL2 stacked on each other. However, the disclosure is not limited thereto, and the encapsulation layer ECL may further include multiple inorganic layers and multiple organic layers.

The first and second inorganic layers IL1 and IL2 may protect the light-emitting element layer LDL from moisture and oxygen outside the display panel DP. The organic layer OL may protect the light-emitting element layer LDL from foreign materials such as particles remaining in a process of forming the first inorganic layer ILL. Each of the first and second inorganic layers IL1 and IL2 may include a silicon nitride layer, a silicon oxynitride layer, a silicon oxide layer, a titanium oxide layer, or an aluminum oxide layer. The organic layer OL may include an acrylate-based organic layer. However, a type of a material is not limited thereto.

The sensing layer ISL may sense an external input. The sensing layer ISL may be formed on the light-emitting element layer LDL using a consecutive process. In this regard, the sensing layer ISL may be directly disposed on the light-emitting element layer IDL. As used herein, one element being 'directly disposed' on another element may mean that no third element is disposed between one element and another element, but one element and another element contact each other. However, this is merely an example, and the sensing layer ISL may be formed separately, and may be combined with the light-emitting element layer LDL via an adhesive member. The disclosure is not limited thereto.

The sensing layer ISL may include multiple conductive layers MTL1 and MTL2 and multiple sensing insulating layers 71, 72, and 73. The sensing layer ISL may include the first to third sensing insulating layers 71, 72, and 73. However, this is shown by way of example, and the number of the sensing insulating layers 71, 72, and 73 constituting the sensing layer ISL is not limited thereto.

The first sensing insulating layer 71 may be an inorganic layer including at least one of silicon nitride, silicon oxynitride, and silicon oxide. In other embodiments, the first sensing insulating layer 71 may be an organic layer including an epoxy resin, an acrylic resin, or an imide-based resin. The first sensing insulating layer 71 may have a single-layer structure or a multi-layer structure in which layers are stacked on each other along the third direction DR3.

The conductive layers MTL1 and MTL2 may include the first conductive layer MTL1 and the second conductive layer MTL2. The first conductive layer MTL1 may be disposed between the first sensing insulating layer 71 and the second sensing insulating layer 72, and the second conductive layer MTL2 may be disposed between the second sensing insulating layer 72 and the third sensing insulating layer 73. A portion of the second conductive layer MTL2 may be connected to the first conductive layer MTL1 via a contact hole CNT formed in the second sensing insulating layer 72. Each of the first and second conductive layers MTL1 and MTL2 may have a single-layer structure or a multi-layer structure in which layers are stacked on each other along the third direction DR3.

The conductive layer having a single-layer structure may include a metal layer or a transparent conductive layer. The metal layer may include molybdenum, silver, titanium, copper, aluminum, and/or an alloy thereof. The transparent conductive layer may include a transparent conductive oxide such as indium tin oxide, indium zinc oxide, zinc oxide, and/or indium zinc tin oxide. In other embodiments, the transparent conductive layer may include a conductive polymer such as PEDOT, a metal nanowire, graphene, and/or the like.

The conductive layer having a multilayer structure may include metal layers. The metal layers may include, for example, a titanium layer/an aluminum layer/a titanium layer. The conductive layer having a multilayer structure may include at least one metal layer and at least one transparent conductive layer.

The first conductive layer MTL1 and the second conductive layer MTL2 may constitute a sensor that detects an external input in the sensing layer ISL. The sensor may operate in a capacitance-based manner or may operate either a mutual-cap scheme or a self-cap scheme. However, this is merely an example, and the sensor may operate in a resistive film-based scheme, an ultrasonic wave-based scheme, or an infrared-ray based scheme in addition to the capacitance-based scheme. The disclosure is not limited thereto.

Each of the first conductive layer MTL1 and the second conductive layer MTL2 may include a transparent conductive oxide or may have a metal mesh shape made of an opaque conductive material. Each of the first conductive layer MTL1 and the second conductive layer MTL2 may be made of each of various materials and may have each of various shapes as long as visibility of the image displayed based on the light generated from the display element layer DP-OLED is not deteriorated. The disclosure is not limited thereto.

The third sensing insulating layer 73 may include an inorganic film. The inorganic film may include at least one of aluminum oxide, titanium oxide, silicon oxide, silicon nitride, silicon oxynitride, zirconium oxide, and hafnium oxide.

In other embodiments, the third sensing insulating layer 73 may include an organic film. The organic film may include at least one of acrylate-based resin, methacrylate-based resin, polyisoprene, vinyl-based resin, epoxy-based resin, urethane-based resin, cellulose-based resin, siloxane-based resin, polyimide-based resin, polyamide-based resin and perylene-based resin.

According to the disclosure, the display panel DP may include the light-emitting contact CE and the driving contact CD spaced apart from each other. Thus, regardless of the configuration of the pixel driver PDC or the position of the connection transistor TR, the position of the light-emitting element LD may be designed as various positions. For example, a degree of freedom in design of the position of light-emitting element LD or in design of the pixel driver PDC may be increased. Further, according to the disclosure, the display panel DP may include the connection wiring CN to facilitate the electrical connection between the second electrode EL2 disposed above the first electrode EL1 serving as an anode and the pixel driver PC. Further, according to the disclosure, the tip TP may be formed in the connection wiring CN such that the organic layer such as the middle layer IML may be readily divided into isolated portions without a separate patterning process. Further, the electrical connection between the second electrode EL2 and the connection wiring CN may be readily realized via the control of the deposition angle.

Figure 7:
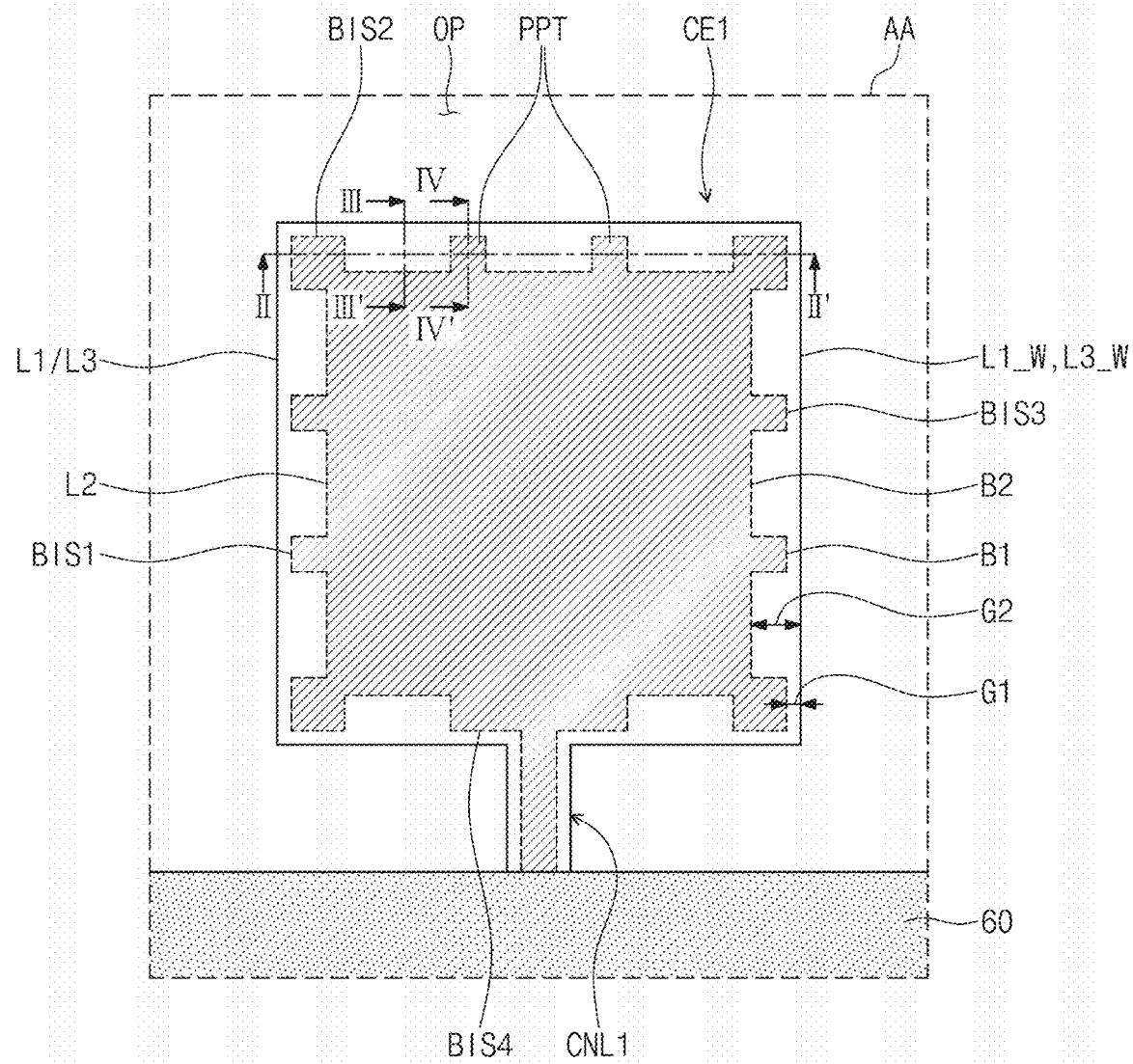
FIG. 7 is a schematic plan view showing area AA as shown in FIG. 4A.

FIG. 7 is a schematic plan view showing area AA shown in FIG. 4A.

Referring to FIG. 4A, FIG. 5 and FIG. 7, the first connection wiring CN1 may include the first light-emitting contact CE1 connected to the second electrode EL2, the first circuit contact CD1 connected to the transistor TR, and a first extension CNL1 connecting the first light-emitting contact CE1 and the circuit contact CD1 to each other. The first connection wiring CN1, the first light-emitting contact CE1, the first driving contact CD1, and the first extension CNL1 are illustrated. However, the disclosure is not limited thereto. Hereinafter, for convenience of description, the first connection wiring CN1 may be referred to as the connection wiring CN1, the first light-emitting contact CE1 may be referred to as the light-emitting contact CE1, the first driving contact CD1 may be referred to as the driving contact CD1, and the first extension CNL1 may be referred to as the extension CNL1.

Each of the light-emitting contact CE1 and the extension CNL1 may include the first layer L1, the second layer L2, and the third layer L3. The second electrode EL2 and the connection transistor TR may be electrically connected to each other via the light-emitting contact CE1 and the extension CNL1.

An open area OP may be formed in which a portion of the sixth insulating layer 60 is removed in an area adjacent to the light-emitting contact CE1. The open area OP may expose a portion of each of the light-emitting contact CE1 and the extension CNL1. The open area OP may be defined as an area in which the sixth insulating layer 60 is partially removed. The second electrode EL2 may be partially discontinuous in the open area OP.

The second layer L2 may include the second side end L2_W located between the first layer L1 and the third layer L3, and the second side end L2_W may be located in the open area OP. For example, the second side end L2_W may be located in an area where the sixth insulating layer 60 and the light-emitting contact CE1 do not overlap each other in a plan view.

The second side end L2_W may include a first portion B1 spaced apart from the third side end L3_W of the third layer L3 by a first spacing G1 in a plan view, and a second portion B2 spaced apart from the third side end L3_W of the third layer L3 by a second spacing G2 greater than the first spacing G1 in a plan view. The second portion B2 may be positioned inwardly of the first portion B1 toward a center of the second layer L2, that is, may be depressed inwardly. The first portion B1 may protrude outwardly of the second portion B2 and thus may constitute a protruding pattern PPT in the light-emitting contact CE.

Referring to FIG. 7, multiple first portions B1 may be provided on the second side end L2_W. The first portions B1 may respectively define multiple protruding patterns PPT in light-emitting contact CE1. The protruding patterns PPT may be spaced apart from each other via the second portion B2 disposed therebetween. Specifically, two adjacent protruding patterns PPT among the protruding patterns PPT may be spaced apart from each other via the second portion B2 disposed therebetween. According to an embodiment of the disclosure, each of the protruding patterns PPT may have a rectangular shape in a plan view. However, the disclosure is not limited thereto, and each of the protruding patterns PPT may have various shapes such as a trapezoid.

In one example of the disclosure, the second portion B2 may have a depth corresponding to a difference between the second spacing G2 and the first spacing G1. In case that the first spacing G1 is 0, the second portion B2 may have a depth corresponding to the second spacing G2. It is shown that depths of the second portions B2 are the same as each other. However, the disclosure is not limited thereto, and the depths of the second portion B2 may be different from each other.

The light-emitting contact CE1 may have a rectangular shape in a plan view, and the second side end L2_W of the second layer L2 may include first to fourth edges BIS1, BIS2, BIS3, and BIS4. Each of the first to fourth edges BIS1, BIS2, BIS3, and BIS4 may include the first portion B1 and the second portion B2. Accordingly, the protruding pattern PPT defined by the first portion B1 may be formed on each of the first to fourth edges BIS1, BIS2, BIS3, and BIS4.

However, in other embodiments, the protruding pattern PPT may be formed only on each of two edges (for example, the first edge BIS1 and the third edge BLS3) facing each other among the first to fourth edges BIS1, BIS2, BIS3, and BIS4. However, the disclosure is not limited thereto, and the protruding pattern PPT may be formed only on one edge among the first to fourth edges BIS1, BIS2, BIS3, and BIS4. This may be freely determined according to a size and a shape of the light-emitting contact CE1.

According to an embodiment of the disclosure as shown, each of four corners may include the protruding pattern PPT. However, the disclosure is not limited thereto, and only one of the corners may include the protruding pattern PPT, or any corner may not include the protruding pattern PPT. A position of the protruding pattern PPT may be freely determined according to a size and a shape of the light-emitting contact CE1.

Figure 8A:
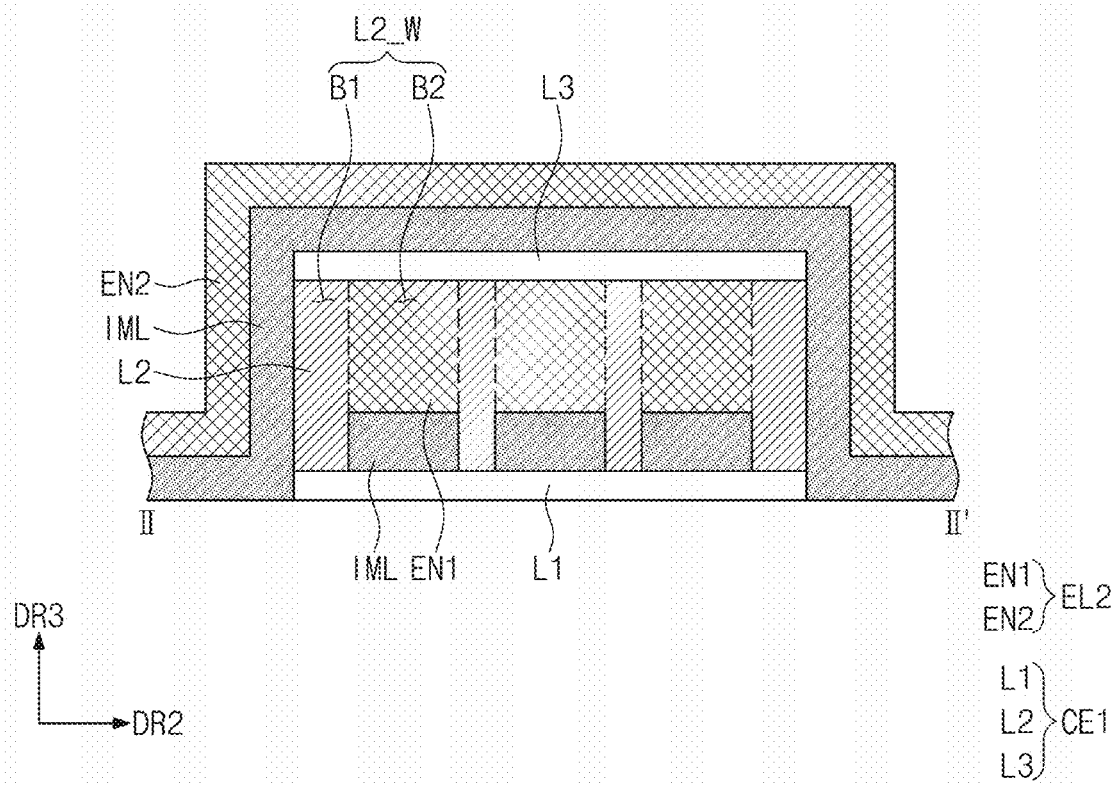
FIG. 8A is a schematic cross-sectional view showing a portion corresponding to line II-II' of FIG. 7.
Figure 8B:
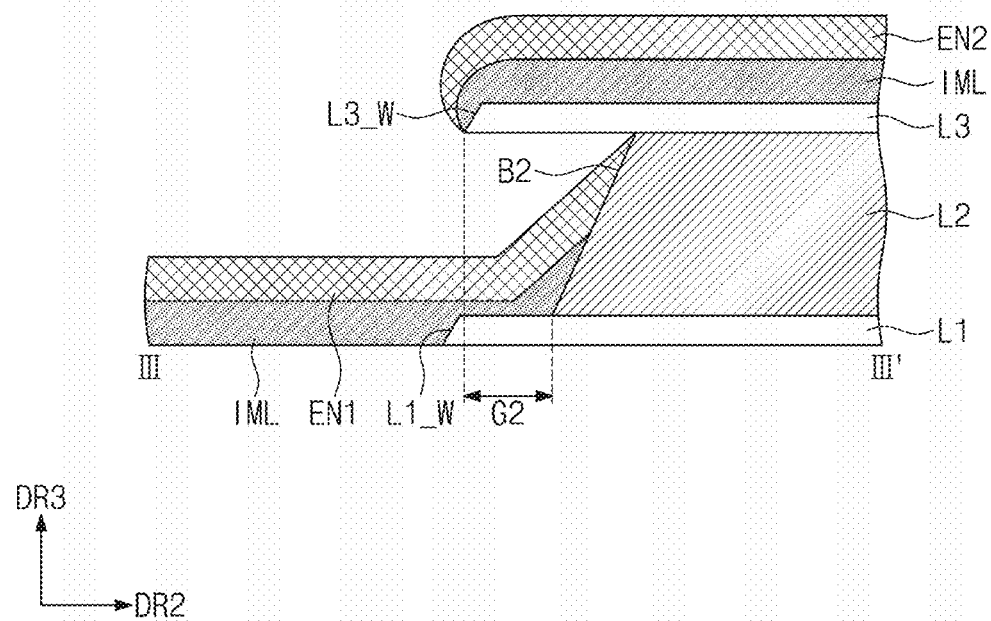
FIG. 8B is a schematic cross-sectional view showing a portion corresponding to line III-III' of FIG. 7.
Figure 8C:
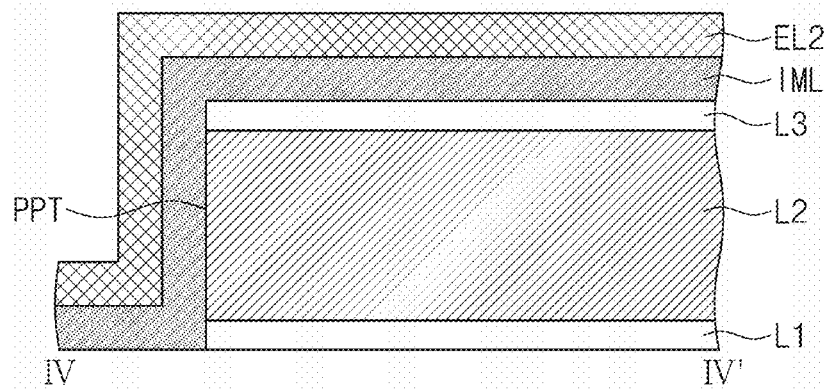
FIG. 8C is a schematic cross-sectional view showing a portion corresponding to a line IV-IV' in FIG. 7.

FIG. 8A is a schematic cross-sectional view showing a portion corresponding to line II-II' of FIG. 7. FIG. 8B is a schematic cross-sectional view showing a portion corresponding to line III-III' in FIG. 7. FIG. 8C is a schematic cross-sectional view showing a portion corresponding to line IV-IV' in FIG. 7.

Referring to FIG. 8A and FIG. 8B, the middle layer IML may be disposed on the light-emitting contact CE1 (FIG. 6), and the second electrode EL2 may be disposed on the middle layer IML. However, the disclosure is not limited thereto, and the light-emitting layer EML (FIG. 5) may be disposed between the light-emitting contact CE1 and the middle layer IML.

The light-emitting contact CE1 may include the first layer L1, the second layer L2 disposed on the first layer L1, and the third layer L3 disposed on the second layer L2. In an embodiment, the first layer L1 may include titanium (Ti), the second layer L2 may include aluminum (Al) or copper (Cu), and the third layer L3 may include titanium (Ti). However, the disclosure is not limited thereto, and the first layer L1 and the third layer L3 may include different materials, and the second layer L2 may include a different material from that of at least one of the first layer L1 and the third layer L3.

A portion of each of the second electrode EL2 and the middle layer IML may be disposed in a recess defined by the second portion B2. Referring to FIG. 8A and FIG. 8B, each of the second electrode EL2 and the middle layer IML may be partially discontinuous due to the second portion B2. The second electrode EL2 may have the first end EN1 and the second end EN2 spaced from each other at the second portion B2. The first end EN1 of the second electrode EL2 may be disposed on the second portion B2 so as to enclose the middle layer IML and may directly contact the second side end L2_W of the second layer L2. Further, the second end EN2 of the second electrode EL2 may be disposed on the third layer L3 so as to enclose the middle layer IML and may directly contact the third layer L3. As the first and second ends EN1 and EN2 of the second electrode EL2 directly contact the second side end L2_W (BISa) of the second layer L2 and the third layer L3, respectively, such that the second electrode EL2 may be electrically connected to the connection wiring CN1. For example, even in case that the second electrode EL2 is disposed on the middle layer IML, the second electrode EL2 may directly contact a portion of the light-emitting contact CE1 exposed through a portion of the first end EN1 discontinuous due to the second portion B2. Therefore, the second electrode EL2 may be electrically connected to the transistor TR (FIG. 5) via the connection wiring CN1 (FIG. 6).

FIG. 8B shows that the portion of the middle layer IML contacts the second side end L2_W of the second layer L2. However, the disclosure is not limited thereto, and a portion of the middle layer IML may not contact the second side end L2_W of the second layer L2, but may only contact the first layer L1.

Referring to FIG. 7 and FIG. 8A, the first spacing G1 may have a size greater than or equal to 0. In case that the first spacing G1 is 0, the first portion B1 of second layer L2 may not be spaced apart from the third side end L3_W of the third layer L3 in a plan view but may be aligned with the third side end L3_W of the third layer L3. Accordingly, each of the middle layer IML and the second electrode EL2 may not be discontinuous at the first portion B1 of the second layer L2 and may extend along and on the first portion B1.

Referring to FIG. 8B, each of the second electrode EL2 and the middle layer IML may be discontinuous due to the second portion B2. The protruding pattern PPT (FIG. 7) may be formed to protrude from the second portion B2 by the second spacing G2. As the second electrode EL2 is discontinuous due to the second portion B2, the second electrode EL2 may have the first end EN1 and the second end EN2 which are disconnected from each other. The first end EN1 among the first end EN1 and the second end EN2 may be connected to the second layer L2 of the light-emitting contact CE1 (FIG. 7). Specifically, as the first end EN1 contacts the second side end L2_W of the second layer L2, the light-emitting element LD including the second electrode EL2 may be connected to the connection wiring CN (FIG. 5), and may be connected to the connection transistor TR.

The middle layer IML and the second electrode EL2 may be formed via deposition. The deposition angle of the middle layer IML and the deposition angle of the second electrode EL2 may be different from each other such that the second electrode EL2 may cover the middle layer IML and may contact the second side end L2_W of the second layer L2.

Referring to FIG. 8C, in an area of the protruding pattern PPT, each of the second electrode EL2 and the middle layer IML may not be discontinuous but may extend in a continuous manner. The middle layer IML may be formed to contact the first side end L1_W and the third side end L3_W of the first and third layers L1 and L3.

Referring to FIG. 7 and FIG. 8C, the first spacing G1 may have a size greater than or equal to 0. According to an embodiment of the disclosure, in case that the first spacing G1 is 0, the first portion B1 of the second layer L2 may not be spaced apart from the third side end L3_W of the third layer L3 in a plan view but may be aligned with the third side end L3_W of the third layer L3. Accordingly, in an area of the protruding pattern PPT, each of the middle layer IML and second electrode EL2 may not be discontinuous but may extend along and on the protruding pattern PPT. Specifically, the middle layer IML may contact the first to third layers L1, L2, and L3 and may be integrally formed. The second electrode EL2 may be formed on the middle layer IML so as to extend in a continuous manner.

Figure 9A:
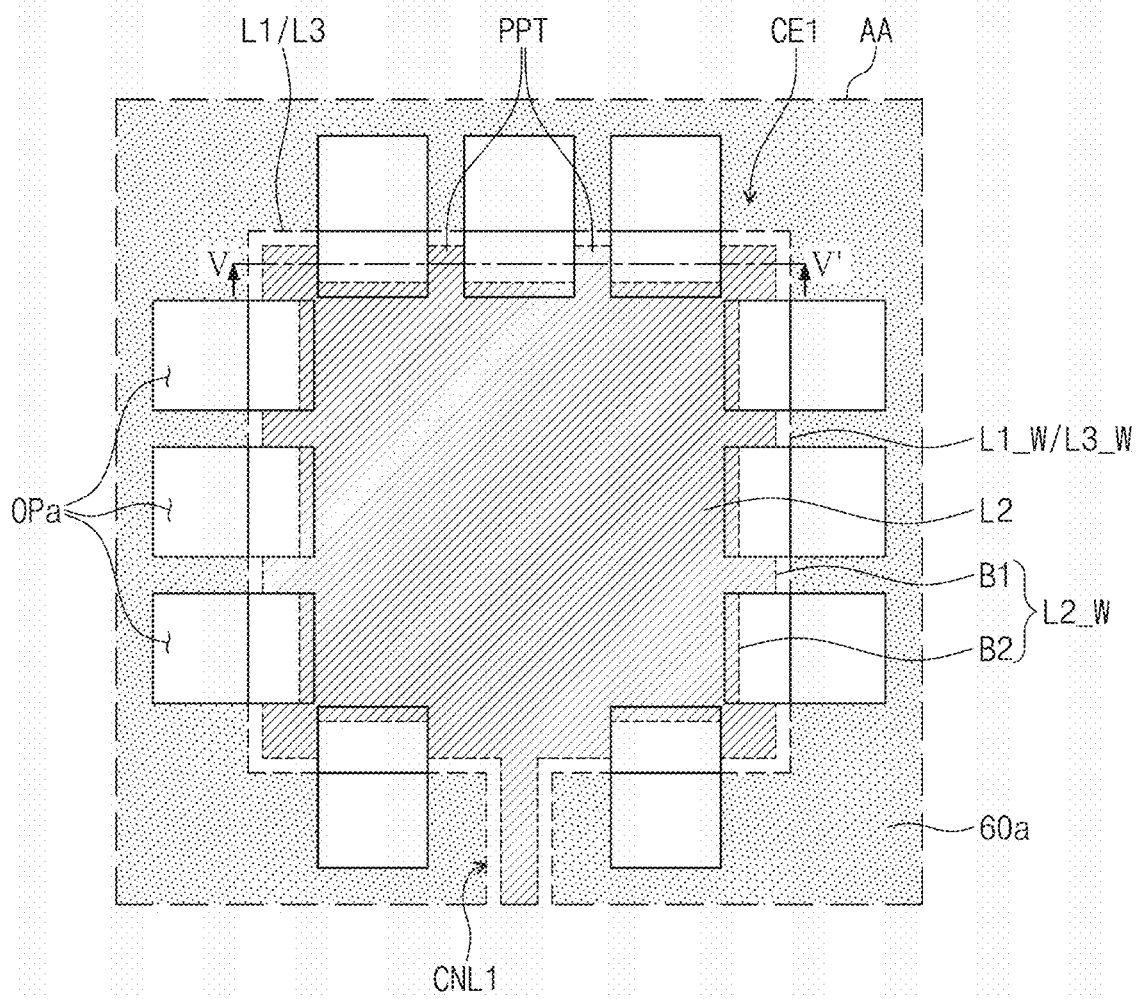
FIG. 9A is a schematic plan view showing area AA as shown in FIG. 4A according to an embodiment.
Figure 9B:
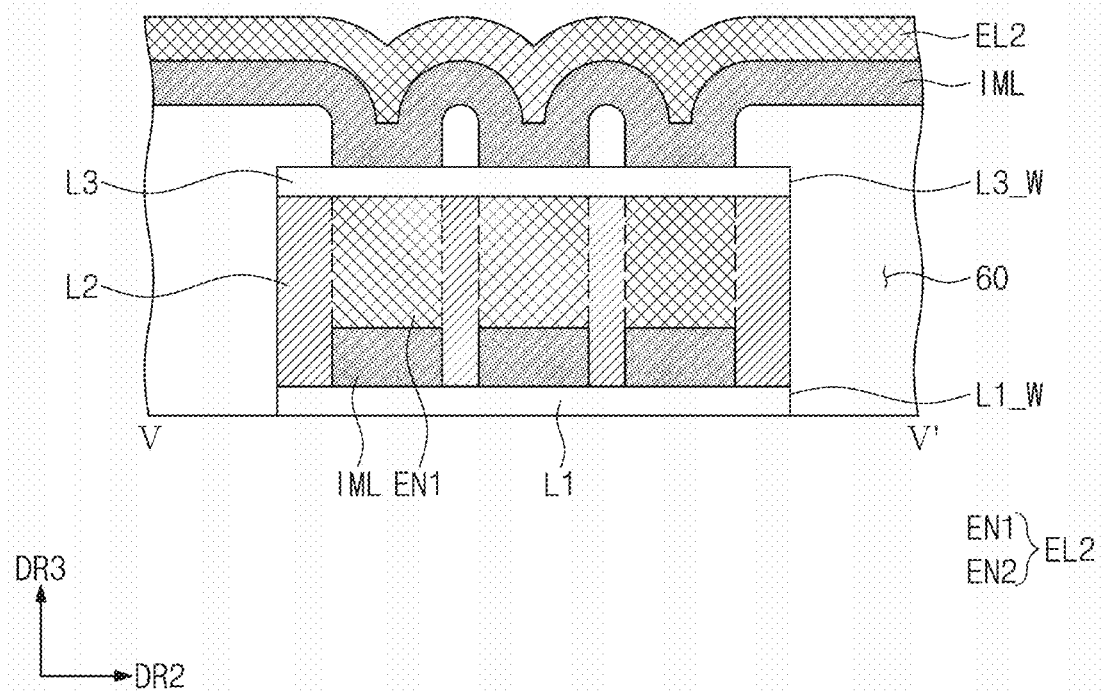
FIG. 9B is a schematic cross-sectional view showing a portion corresponding to line V-V' of FIG. 8A.

FIG. 9A is a schematic plan view showing area AA shown in FIG. 4B according to an embodiment. FIG. 9B is a schematic cross-sectional view showing a portion corresponding to line V-V' in FIG. 9A.

Referring to FIG. 9A and FIG. 9B, a sixth insulating layer 60a may include multiple open areas OPa. The open areas OPa may expose an end of the connection wiring CN1. Specifically, a portion of the light-emitting contact CE1 may be exposed through the open area. Each of the open areas OPa may be defined as an area excluding an area of the sixth insulating layer 60a. The second portion B2 may be formed in the open areas OPa. Specifically, the protruding patterns PPT may be respectively formed in the open areas OPa. The second electrode EL2 may be discontinuous at each of the open areas OPa.

The light-emitting contact CE1 according to an embodiment of the disclosure may come into contact with the sixth insulating layer 60a and overlap a portion of the sixth insulating layer 60a in a plan view. As shown, the sixth insulating layer 60a may contact a portion of the second side end L2_W of the light-emitting contact CE1 corresponding to the first portion B1 and may overlap an area corresponding to the first portion B1 in the third direction DR3. Specifically, the sixth insulating layer 60a may not overlap the second portion B2. The sixth insulating layer 60a may not overlap a recess defined by the second portion B2 in the third direction DR3. The light-emitting contact CE1 of this embodiment may be the same as that of FIG. 7A. However, this embodiment may be different from FIG. 7A in that the sixth insulating layer 60a partially overlaps the light-emitting contact CE1. Thus, manufacturing methods thereof may be different from each other. This will be described later in FIG. 9A and FIG. 9B.

Referring to FIG. 4A to FIG. 9B as described above, the display panel DP of an embodiment may include the light-emitting connection contact CE and the driving contact CD spaced apart from each other. The location of the light-emitting elements LD (FIG. 2A) may be designed regardless of the position of the pixel driver PDC (FIG. 2A).

Further, the light-emitting element LD may include the first electrode EL1 disposed on the driving element layer DDL, the light-emitting layer EML disposed on the first electrode EL1, the middle layer IML disposed on the light-emitting layer EML, and the second electrode EL2 disposed on the middle layer IML. Thus, an operation voltage thereof may be low and light-emitting efficiency thereof may be excellent. Further, as the second electrode EL2 is connected to the connection transistor TR, the voltage of the transistor may not be affected by deterioration of the light-emitting element. Accordingly, the display panel DP including the light-emitting elements LD of the disclosure may have reduced afterimage defect and improved lifespan compared to a conventional display panel in which the first electrode EL1 is connected to the connection transistor TR.

Figure 10B:
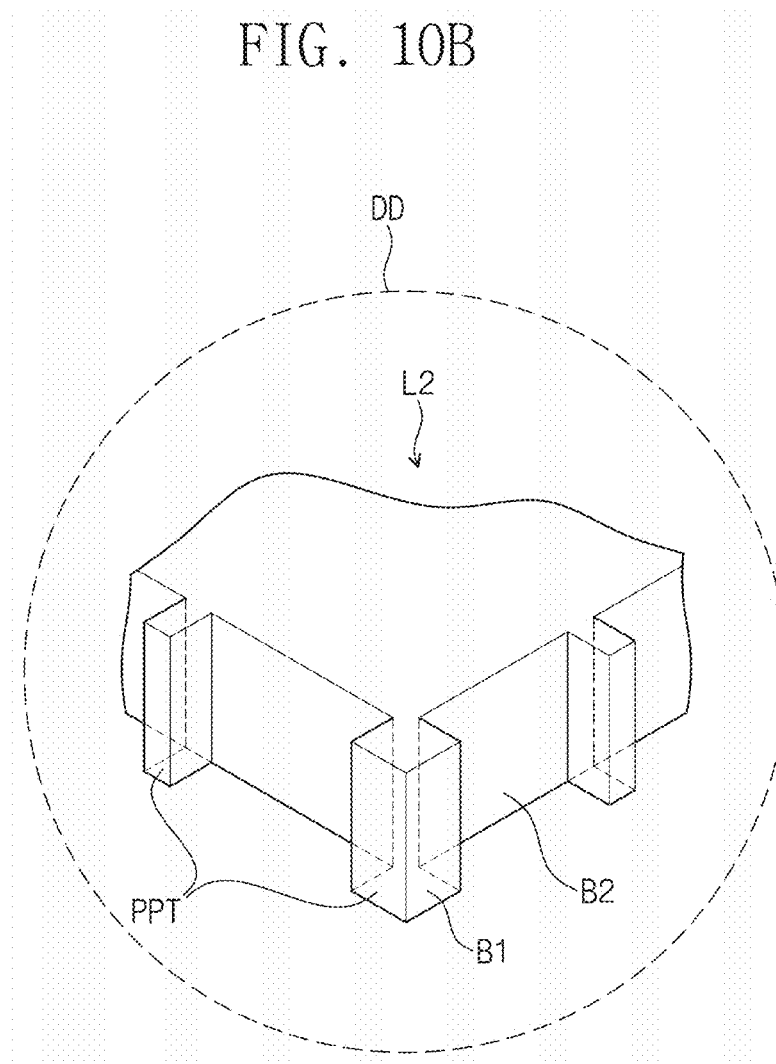
FIG. 10B is an enlarged schematic perspective view showing area DD of FIG. 10A.

FIG. 10A is a schematic plan view of the second layer according to an embodiment of the disclosure. FIG. 10B is an enlarged schematic perspective view of area DD in FIG. 10A.

Referring to FIG. 7, FIG. 8B, and FIG. 10A, the second side end L2_W of the second layer L2 may include the first portion B1 and the second portion B2, and the protruding pattern PPT may be defined by the first portion B1. For example, in an area of the second portion B2, the third side end L3_W of the third layer L3 may be positioned outwardly beyond the second side end L2_W of the second layer L2. The light-emitting contact CE1 according to the disclosure may not have a tip structure along an entirety of the second side end L2_W of the second layer, but may have a tip structure only at a portion (that is, the second portion) of the second side end L2_W of the second layer L2. As an area of the light-emitting contact having the tip structure increases, a phenomenon that the third side end L3_W of the third layer L3 (FIG. 8A) lifts off in the third direction DR3 or collapses due to a cleaning process as a subsequent process may increase. However, the light-emitting contact CE1 according to the disclosure has the tip structure only at the portion (that is, the second portion B2) of the second side end L2_W of the second layer L2, and a portion of the third side end L3_W of the third layer L3 corresponding to the first portion B1 is supported by the protruding pattern PPT. As a result, the lift-off or the collapse of the third side end L3_W of the third layer L3 may be prevented in a subsequent process. Further, in a large panel, a size of the light-emitting contact CE1 should be increased in a corresponding manner to a size of the light-emitting element LD (FIG. 4A), so that sufficient current may flow. In this regard, forming the protruding patterns PPT respectively at portions of the second side end L2_W of the light-emitting contact CE1 may allow the lift-off or collapse phenomenon to be prevented. Thus, a reliable display panel DP (FIG. 5) may be realized.

Referring to FIG. 10B, the first portion B1 may be formed at a corner, and the second portion B2 may be formed in an area adjacent to the corner. As the first portion B1 is formed at the corner, the collapse of the end of the third layer L3 (FIG. 8A) may be prevented.

Referring to FIG. 8A and FIG. 10B, the second side end L2_W of the second layer L2 may include a partially etched portion. Although not shown, the open area OP may be formed around the light-emitting contact CE1 (FIG. 8A), and a separate organic layer may be formed in a portion corresponding to the first portion B1. The organic layer may be formed using photolithography processes. In the etching process for forming the protruding pattern PPT on the second side end L2_W, the organic layer serves as a mask so that the first, second and third layers L1, L2 and L3 may be partially etched. In this process, an etching rate of the third layer L3 may be lower than an etching rate of the second layer L2. In the second portion formed through the etching process, the second electrode EL2 may contact the second side end L2_W of the second layer L2, and the lift-off in the third direction DR3 of the third side end L3_W of the third layer L3 or the collapse of the third side end L3_W of the third layer L3 may be prevented due to the protruding pattern PPT. After the process has been completed, the organic layer may be removed.

Referring to FIG. 9B and FIG. 10B, the sixth insulating layer 60 may contact a portion of the second side end L2_W corresponding to the first portion B1, and may also come into contact with the portion thereof corresponding to the first portion B1 in the third direction DR3. For example, a process of forming the protruding pattern PPT as shown in FIG. 9B may include providing the sixth insulating layer 60a covering the light-emitting contact CE1, and forming the open areas OPa (FIG. 8A) respectively at portions of the sixth insulating layer 60 via a photolithography process. The open areas OPa may correspond to the second portion B2, and the sixth insulating layer 60a may serve as a mask for forming the protruding patterns PPT on the second side end L2_W. Unlike what is shown in FIG. 8A, even after the protruding patterns PPT have been formed, the sixth insulating layer 60a may not be removed but may remain.

Figure 11:
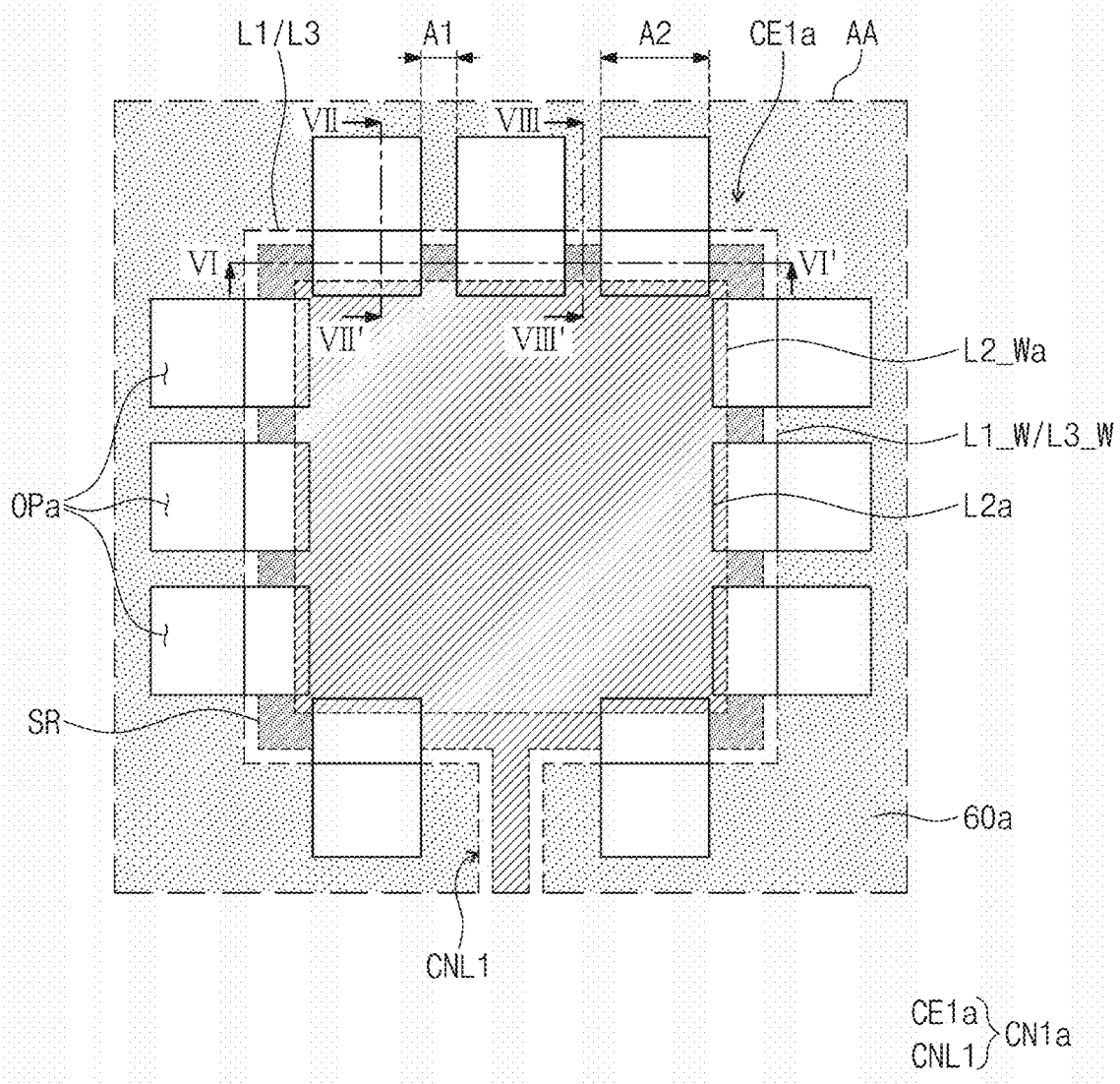
FIG. 11 is a schematic plan view showing area AA as shown in FIG. 4A according to an embodiment of the disclosure.
Figure 12A:
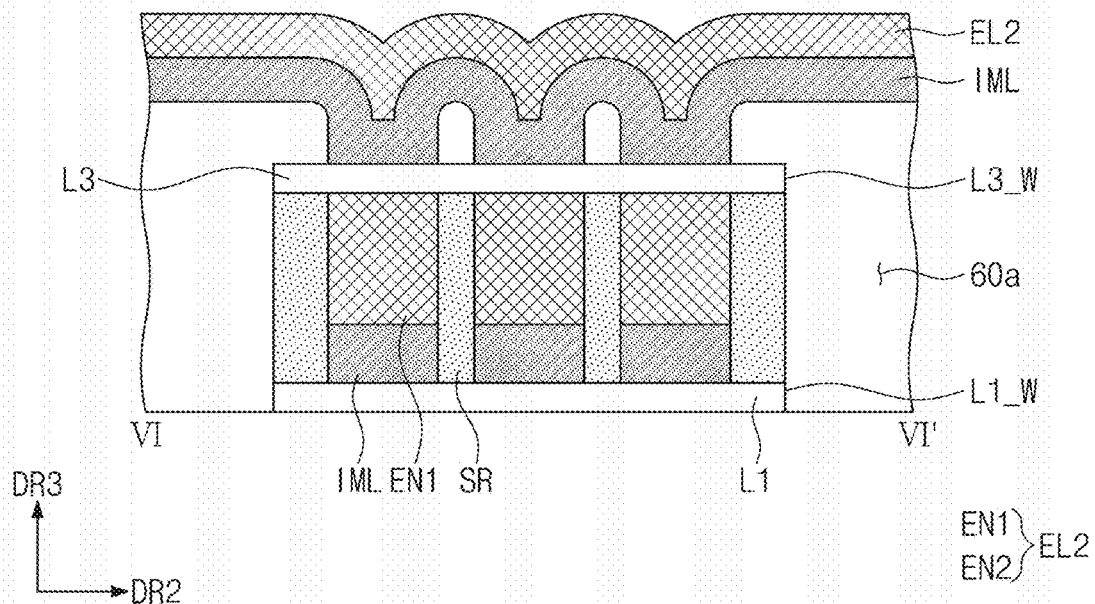
FIG. 12A is a schematic cross-sectional view showing a portion corresponding to line VI-VI' in FIG. 11.
Figure 12B:
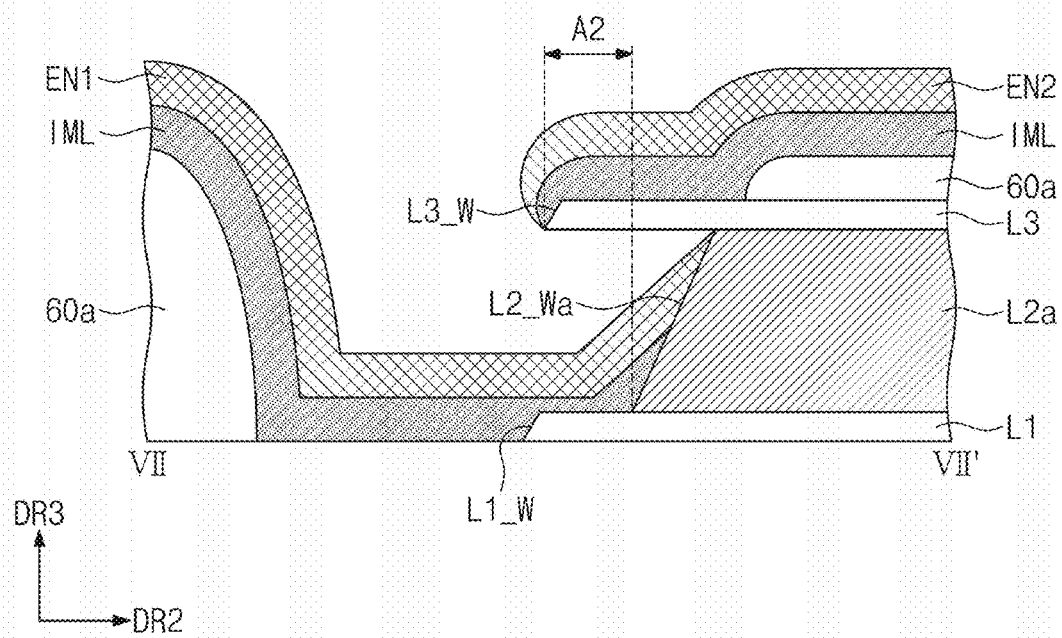
FIG. 12B is a schematic cross-sectional view showing a portion corresponding to line VII-VII' in FIG. 11.
Figure 12C:
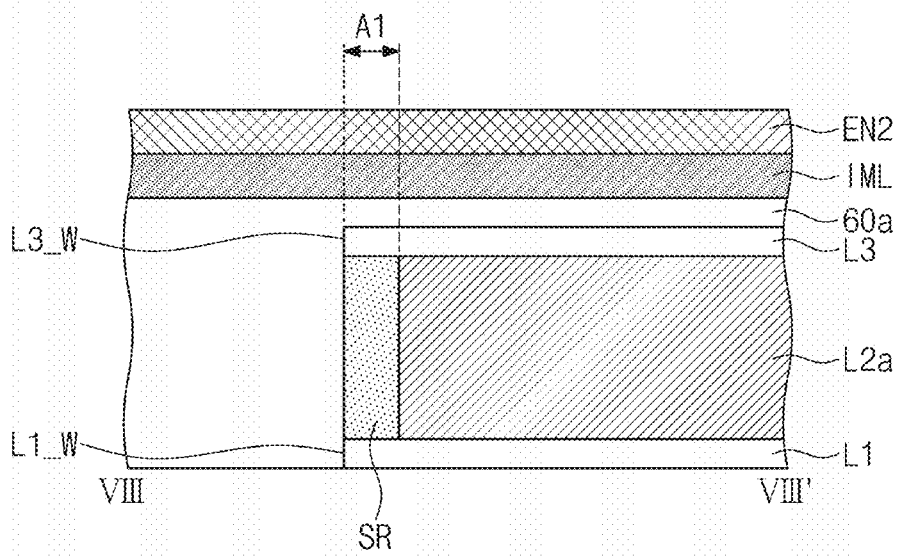
FIG. 12C is a schematic cross-sectional view showing a portion corresponding to line VIII-VIII' of FIG. 11.

FIG. 11 is a schematic plan view showing area AA as shown in FIG. 4B according to an embodiment of the disclosure. FIG. 12A is a schematic cross-sectional view showing a portion corresponding to line VI-VI' in FIG. 11. FIG. 12B is a schematic cross-sectional view showing a portion corresponding to line VII-VII' in FIG. 11. FIG. 12C is a schematic cross-sectional view showing a portion corresponding to line VIII-VIII' in FIG. 11.

Referring to FIG. 5 and FIG. 11, the connection wiring CN1a may include a light-emitting contact CE1a connected to the second electrode EL2 and the extension CNL1 connected to the connection transistor TR. Each of the light-emitting contact CE1a and the extension CNL1 may include the first layer L1, a second layer L2a, and the third layer L3. The second electrode EL2 and the connection transistor TR may be electrically connected to each other via the light-emitting contact CE1a and the extension CNL1.

Referring to FIG. 11 and FIG. 12B, the first side end L1_W of the first layer L1 and the third side end L3_W of the third layer L3 may be positioned beyond a second side end L2_Wa of the second layer L2a. Accordingly, in the light-emitting contact CE1a, there is an area where the first layer L1 and the third layer L3 do not overlap the second layer L2a in a plan view. In the area in which the first layer L1 and the third layer L3 does not overlap the second layer L2a in the plan view, a support SR supporting the third side end L3_W of the third layer L3 may be partially disposed. In this regard, the area in which the support SR is disposed may be defined as a first area A1, and an area in which the support SR is not disposed may be defined as a second area A2.

Multiple first areas A1 may be provided, and multiple supports SR may be respectively formed in the first areas A1. The supports SR may be spaced apart from each other via the second area A2. Specifically, two adjacent supports SR among the supports SR may be spaced apart from each other via the second area A2. According to an embodiment of the disclosure, all of distances between adjacent supports SR among the supports SR may be the same as each other. For example, widths of the second areas A2 may be the same as each other. However, the disclosure is not limited thereto, and some of the distances between adjacent supports SR among the supports SR may be the same as each other. In other embodiments, all of the distances between adjacent supports SR among the supports SR may be different from each other.

Referring to FIG. 12A, the sixth insulating layer 60a may be disposed on the light-emitting contact CE1a, the middle layer IML may be disposed on the sixth insulating layer 60a, and the second electrode EL2 may be disposed on the middle layer IML.

The light-emitting contact CE1a may include the first layer L1, the second layer L2a disposed on the first layer L1, and the third layer L3 disposed on the second layer L2a. In an embodiment, the first layer L1 may include titanium (Ti), the second layer L2a may include aluminum (Al) or copper (Cu), and the third layer L3 may include titanium (Ti). However, the disclosure is not limited thereto, and the first layer L1 and the third layer L3 may include different materials, or the second layer L2a may include a different material from that of at least one of the first layer L1 and the third layer L3.

According to an embodiment of the disclosure, the support SR disposed in the first area A1 may be disposed between the first layer L1 and the third layer L3, and may be formed to contact the second side end L2_Wa (FIG. 11) of the second layer L2. The first areas A1 may be provided, and the supports SR may be respectively disposed in the first areas A1. Each of the supports SR may be in contact with the first layer L1 and the third layer L3. Each of the supports SR may have a rectangular shape when viewed in a direction toward the second side end L2_Wa of the second layer L2a. However, the disclosure is not limited thereto, and the supports SR may have the same shape, or may have different shapes or may have various shapes such as a trapezoid.

According to an embodiment of the disclosure, the supports SR may contact the sixth insulating layer 60a, and the light-emitting contact CE1a may overlap a portion of the sixth insulating layer 60a in a plan view. Specifically, the sixth insulating layer 60a may overlap an area corresponding to the support SR in the third direction DR3. The sixth insulating layer 60 may not be disposed in second area A2. Each of the supports SR may include an organic material. However, the disclosure is not limited thereto, and each of the supports SR may include the same material as that of the second layer L2a, or may include the same material as that of the sixth insulating layer 60 and thus may be integrally formed with the sixth insulating layer 60.

Referring to FIG. 11 and FIG. 12B, the sixth insulating layer 60a may include the open areas OPa. The open areas OPa may expose an end of the connection wiring CN1. Specifically, a portion of the light-emitting contact CE1a may be exposed through the open area. The open areas OPa may be defined as an area excluding the area of the sixth insulating layer 60. The second electrode EL2 may be discontinuous in the open areas OPa. Each of the open areas OPa may include the second area A2 in which the support SR is not disposed. Specifically, the support SR may not be disposed in each of the open areas OPa, and a tip structure in which the third side end L3_W of the third layer L3 is positioned beyond the second side end L2_Wa of the second layer L2 may be formed in the open area.

Referring to FIG. 12B, each of the second electrode EL2 and the middle layer IML may be partially discontinuous due to the second area A2. Thus, the second electrode EL2 which is discontinuous in the second area A2 may have the first end EN1 and the second end EN2 spaced from each other. The first end EN1 of the second electrode EL2 may be disposed in the second area A2 so as to surround a portion of the middle layer IML and may directly contact the second side end L2_Wa of the second layer L2a. Further, the second end EN2 of the second electrode EL2 may surround a portion of the middle layer IML and may be disposed on the third layer L3. As the first end EN1 of the second electrode EL2 directly contacts the second side end L2_Wa of the second layer L2a, the second electrode EL2 may be electrically connected to the connection wiring CN1a (FIG. 11). For example, the second electrode EL2 may be electrically connected to the transistor TR (FIG. 5) via the connection wiring CN1a.

After the open area OPa has been defined in the sixth insulating layer 60, the middle layer IML and the second electrode EL2 may be deposited thereon. The middle layer IML and the second electrode EL2 may be formed via deposition. The deposition angle of the middle layer IML and the deposition angle of the second electrode EL2 to be different from each other may be controlled such that the second electrode EL2 may be formed to cover the middle layer IML and contact the second side end L2_Wa of the second layer L2a.

Referring to FIG. 12C, in the first area A1 where the support SR is disposed, each of the second electrode EL2 and the middle layer IML may not be discontinuous but may extend in a continuous manner. Specifically, each of the second electrode EL2 and the middle layer IML may not be discontinuous but may extend in a continuous manner while being disposed on the sixth insulating layer 60a.

Referring to FIG. 11 and FIG. 12C, the support SR may not be spaced from the third side end L3_W of the third layer L3 in a plan view and may be aligned with the third side end L3_W of the third layer L3. Accordingly, in the first area A1 of the second layer L2, each of the middle layer IML and second electrode EL2 may not be discontinuous but may extend in a continuous manner while being disposed on the support SR. Specifically, the sixth insulating layer 60a may contact the first layer L1, the support SR, and the third layer L3 so as to cover the first layer L1, the support SR, and the third layer L3. The middle layer IML may be directly disposed on the sixth insulating layer 60a, and the second electrode EL2 may be discontinuous but may extend in a continuous manner while being disposed on the middle layer IML.

Figure 13A:
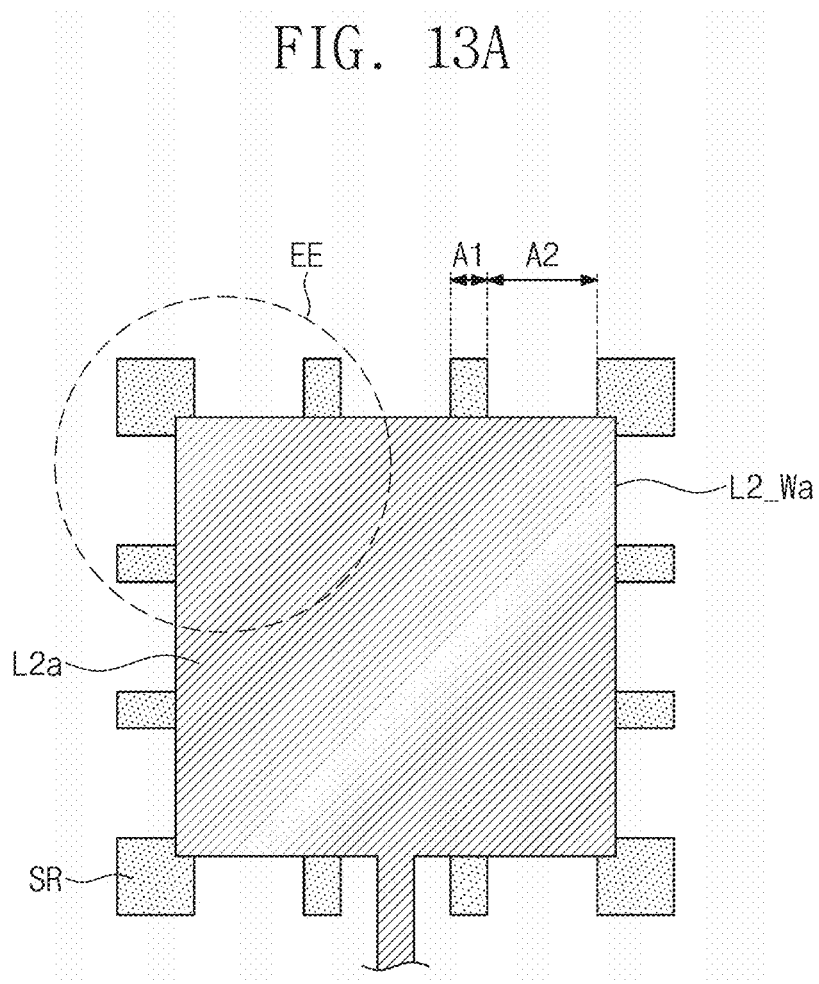
FIG. 13A is a schematic plan view of a second layer and a support according to an embodiment of the disclosure.
Figure 13B:
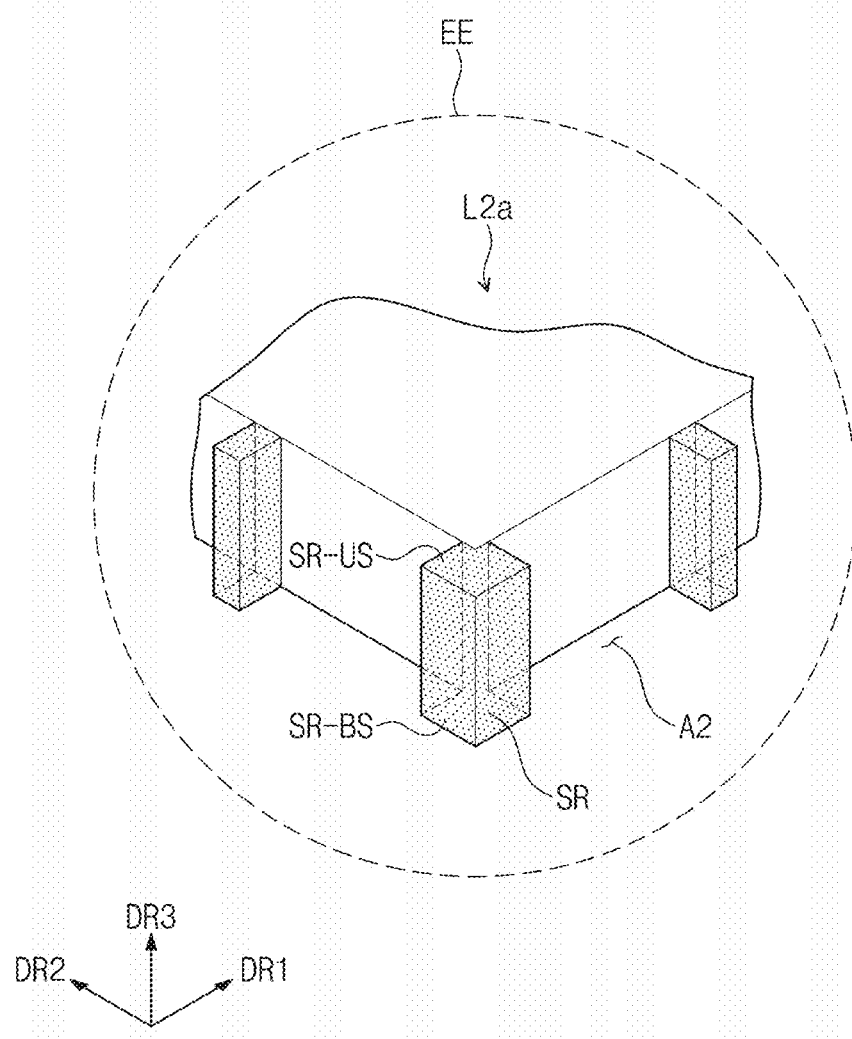
FIG. 13B is an enlarged schematic perspective view showing area EE of FIG. 13A.

FIG. 13A is a schematic plan view of the second layer L2a and the support SR according to an embodiment of the disclosure. FIG. 13B is an enlarged schematic perspective view of area EE of FIG. 13A.

Referring to FIG. 11, FIG. 12B, and FIG. 13A, the support SR may be formed in the first area A1. The first areas A1 may be provided, and thus, the supports SR may be respectively formed in the first areas A1. According to the disclosure, the light-emitting contact CE1a may not have a tip structure along an entirety of the second side end L2_Wa of the second layer but may have a tip structure only in the second area A2. For example, the tip structure may be partially formed in the second area A2 where the support SR is not formed. As an area of the light-emitting contact CE1a having the tip structure increases, a phenomenon that the third side end L3_W of the third layer L3 (FIG. 8A) lifts off in the third direction DR3 or collapses due to a cleaning process as a subsequent process may increase. However, according to the disclosure, the light-emitting contact CE1a may have the tip structure only in the second area A2, and the third side end L3_W of the third layer L3 may be supported by the support SR. As a result, the lift-off or collapse of the third side end L3_W of the third layer L3 may be prevented in the subsequent process. Further, in a large panel, a size of the light-emitting contact CE1a should be increased in a corresponding manner to a size of the light-emitting element LD (FIG. 4A), so that sufficient current may flow. In this regard, forming the supports SR respectively at portions of the second side end L2_Wa of the light-emitting contact CE1a may allow the lift-off or collapse phenomenon to be prevented. Thus, a reliable display panel DP (FIG. 5) may be realized.

Referring to FIG. 12A and FIG. 13B, the support SR may include a bottom face SR-DS in contact with the first layer L1, and a top face SR-US spaced apart from the bottom face SR-DS in the third direction DR3 and in contact with the third layer L3. As the support SR is formed so as to be in contact with the first layer L1 and the third layer L3, the support SR may serve to partially support the third side end L3_W of the third layer L3, thereby preventing the third side end L3_W of the third layer L3 from collapsing. A shape of each of the bottom face SR-DS and the top face SR-US of the support SR may be rectangular. However, the disclosure is not limited thereto, and each of the bottom face SR-DS and the top face SR-US of the support SR may have various shapes such as a trapezoidal or circular shape.

Referring to FIG. 13B, the second layer L2a may include a corner. According to an embodiment of the disclosure, the support SR may adjacent to the corner. Specifically, the support SR may be formed so as to surround the corner. However, the disclosure is not limited thereto, and the support SR may not be adjacent to the corner, or may be formed so as to be in contact only with a portion of the corner. The second area A2 may be adjacent to the support SR. A spacing between the support SR adjacent to the corner and another support SR adjacent thereto may be the same as a width of the second area A2 adjacent thereto. As the support SR is formed at the corner, the lift-off or collapse of the third side end L3_W of the third layer L3 (FIG. 11A) at the corner may be prevented, compared to a case in which the support SR is formed in an area other than the corner.

Figure 14:
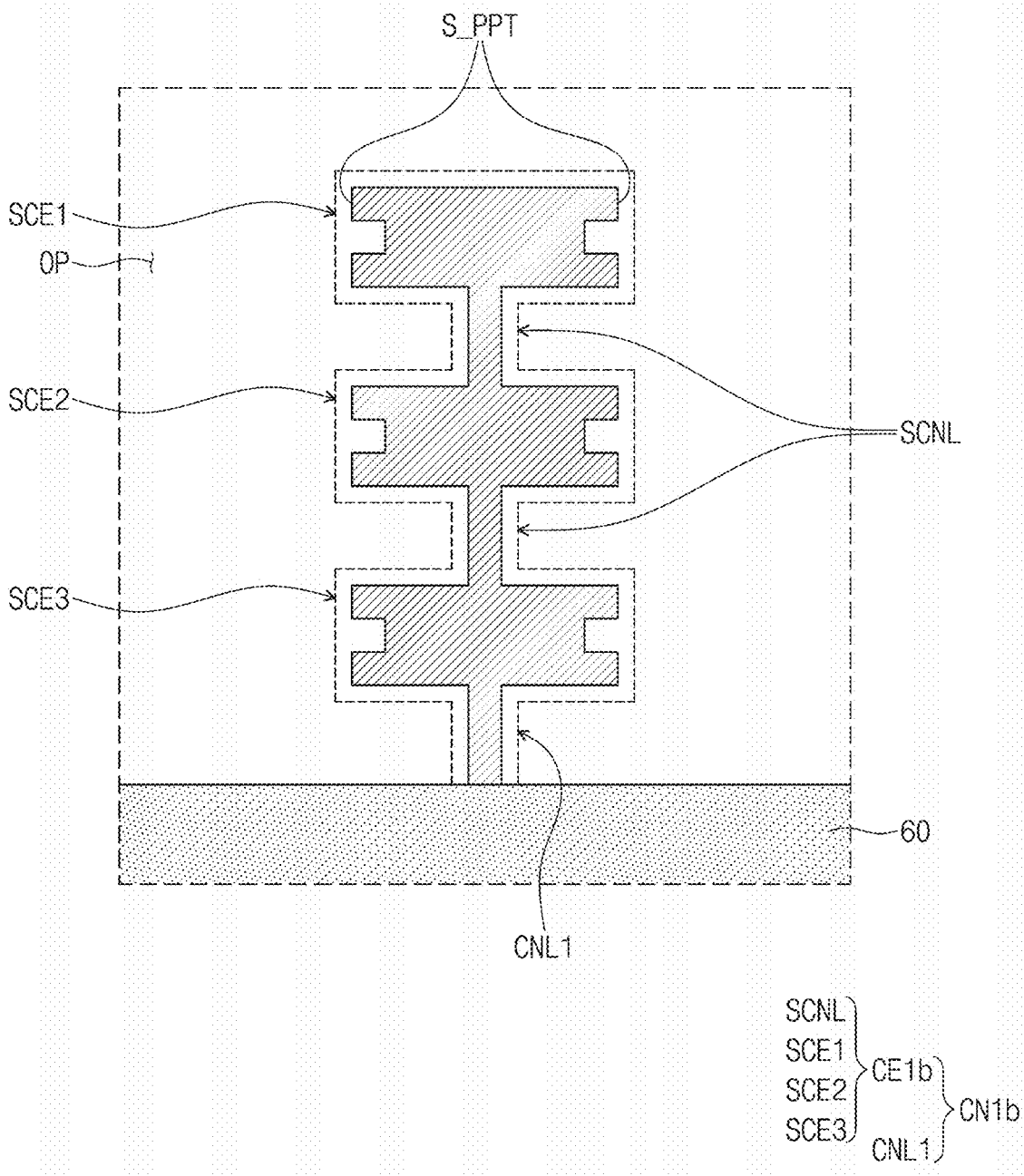
FIG. 14 is a schematic plan view according to an embodiment of the disclosure.

FIG. 14 is a schematic plan view according to an embodiment of the disclosure.

Referring to FIG. 14, a connection wiring CN1b may include a light-emitting contact CE1b connected to the second electrode EL2 and the extension CNL1 connected to the connection transistor TR. An open area OP in which a portion of the sixth insulating layer 60 is removed may be formed in an area adjacent to the light-emitting contact CE1b. The open area OP may expose an end of the connection wiring CN1. Specifically, a portion of each of the light-emitting contact CE1b and the extension CNL1 may be exposed through the open area. The open area OP may be defined as an area from which the sixth insulating layer 60 is removed. The second electrode EL2 may be partially discontinuous in the open area OP.

The light-emitting contact CE1b may include first to third sub-light-emitting contacts SCE1, SCE2, and SCE3, and a sub-extension SCNL. The first to third sub-light-emitting contacts SCE1, SCE2, and SCE3 may be electrically connected to each other via the sub-extension SCNL. Specifically, in case that a tip structure in contact with the second electrode EL2 is formed in at least one of the first sub-light-emitting contact SCE1, the second sub-light-emitting contact SCE2, and the third sub-light-emitting contact SCE3, the second electrode EL2 and the connection transistor TR may be electrically connected to each other via the sub-extension SCNL. According to an embodiment of the disclosure, the first to third sub-light-emitting contacts SCE1, SCE2, and SCE3 may have the same rectangular shape in a plan view. However, the disclosure is not limited thereto. A shape in a plan view of each of the first to third sub-light-emitting contacts SCE1, SCE2, and SCE3 may be freely modified. The light-emitting contact CE1b may include four or more sub-light-emitting contacts.

Each of the first to third sub-light-emitting contacts SCE1, SCE2, and SCE3 may include a sub-protruding pattern S_PPT. As shown, multiple sub-protruding patterns S_PPT may be formed in each of the sub-light-emitting contacts SCE1, SCE2, and SCE3. However, the disclosure is not limited thereto. Only one of the first to third sub-light-emitting contacts SCE1, SCE2, and SCE3 may include the sub-protruding pattern S_PPT.

Figure 15:
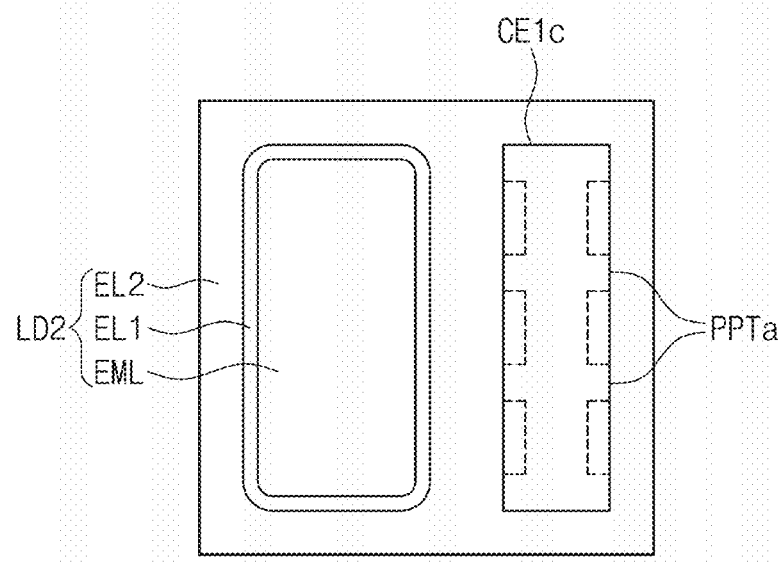
FIG. 15 is an enlarged schematic plan view of a partial area of a display panel.

FIG. 15 is an enlarged schematic plan view of a partial area of a display panel.

Referring to FIG. 4B and FIG. 15, the light-emitting elements LD include a first light-emitting element LD1, a second light-emitting element LD2, and a third light-emitting element LD3. Each of the first light-emitting element LD1, the second light-emitting element LD2, and the third light-emitting element LD3 may include the first electrode EL1, the light-emitting layer EML, and the second electrode EL2. The light-emitting elements LD may be isolated from each other via the separator SPR in a plan view. In FIG. 15, it is shown that a point in a plan view where the second electrode EL2 is connected to the connection wiring CN1 is a light-emitting contact CE1c. According to an embodiment of the disclosure, the light-emitting contact CE1c may be formed so as to have a size corresponding to a size of the second light-emitting element LD2. The light-emitting contact CE1c may include multiple protruding patterns PPTa at each of both opposing ends thereof facing each other. However, the disclosure is not limited thereto, and the protruding patterns PPTa may be formed only at an end thereof.

As a size of the display panel included in an electronic device such as a TV and a monitor increases, a larger amount of current should be transmitted to a drain electrode. Thus, a size of the light-emitting contact CE1c may be increased. In this regard, as the size of the light-emitting contact CE1c increases, the collapse of the side end, that is, the tip of the third layer L3 (FIG. 8C) may occur as described above. For this reason, the protruding patterns PPTa are formed in the light-emitting contact CE1c to prevent the collapse. Thus, a reliable display panel may be provided.

According to an embodiment of the disclosure, the protruding patterns may be respectively formed at portions of the side end of the light-emitting contact having the tip structure, preventing the lift-off or collapse of the tip. Thus, a reliable display panel may be realized.

While the disclosure has been described with reference to embodiments thereof, it will be apparent to those of ordinary skill in the art that various changes and modifications may be made thereto without departing from the spirit and scope of the disclosure.

What is claimed is:

1. A display panel, comprising:
a transistor;
a light-emitting element including:
 a first electrode;
 a light emitting layer disposed on the first electrode; and
 a second electrode disposed on the light emitting layer, the second electrode being electrically connected to the transistor;
an insulating layer disposed between the transistor and the light-emitting element; and
a connection wiring electrically connecting the transistor and the second electrode to each other, wherein
the connection wiring includes:
 a first contact electrically connected to the second electrode; and
 a second contact electrically connected to the transistor,
the first contact includes:
 a first layer;
 a second layer disposed on the first layer; and
 a third layer disposed on the second layer,
the second layer including a second side end disposed between the first layer and the third layer, and
the second side end includes:
 a first portion spaced apart from a third side end of the third layer by a first spacing in a plan view of the display panel; and
 a second portion spaced apart from the third side end by a second spacing larger than the first spacing in the plan view.

2. The display panel of claim 1, wherein
the second electrode is partially discontinuous due to the second portion, and
the second electrode has a first end and a second end spaced apart from each other.

3. The display panel of claim 2, wherein
the first end is disposed on the second portion and contacts the first layer and the second layer, and
the second end is disposed on the third layer.

4. The display panel of claim 1, wherein a protruding pattern is disposed at the second side end and is defined by the first portion.

5. The display panel of claim 4, wherein
the first portion includes a plurality of first portions,
the protruding pattern includes a plurality of protruding patterns which are defined by the plurality of first portions, and
two adjacent protruding patterns among the plurality of protruding patterns are spaced apart from each other via the second portion.

6. The display panel of claim 5, wherein
the second portion includes a plurality of second portions, and
the second spacing between one of the plurality of second portions and the third side end is different the second spacing between another one of the plurality of second portions and the third side end.

7. The display panel of claim 4, wherein
the second side end includes first to fourth edges, and
the protruding pattern is disposed at one or more of the first to fourth edges.

8. The display panel of claim 7, wherein the protruding pattern is disposed on each of the first edge and the third edge opposite to each other.

9. The display panel of claim 1, wherein
the second side end includes four corners, and
at least one of the four corners includes the first portion.

10. The display panel of claim 1, wherein
the first contact includes a plurality of first sub-contacts, and
the plurality of first sub-contacts are electrically connected to each other.

11. The display panel of claim 10, wherein each of the plurality of first sub-contacts includes a sub-protruding pattern.

12. The display panel of claim 11, wherein the sub-protruding pattern has a rectangular shape in the plan view.

13. The display panel of claim 1, wherein the second side end is disposed in an area in which the insulating layer and the first contact do not overlap each other in the plan view.

14. The display panel of claim 1, wherein
the first portion is disposed in an area in which the insulating layer and the first contact overlap each other in the plan view, and
the first portion contacts the insulating layer.

15. A display panel, comprising:
a transistor;
a light-emitting element including:
 a first electrode;
 a light emitting layer disposed on the first electrode; and
 a second electrode disposed on the light emitting layer, the second electrode being electrically connected to the transistor;
an insulating layer disposed between the transistor and the light-emitting element; and
a connection wiring electrically connecting the transistor and the second electrode to each other, wherein
the connection wiring includes:
 a first contact electrically connected to the second electrode; and
 a second contact electrically connected to the transistor,
the first contact includes:
 a first layer;
 a second layer disposed on the first layer;
 a third layer disposed on the second layer; and
 a support,
each of a first side end of the first layer and a third side end of the third layer is positioned beyond a second side end of the second layer, and
a first area in which the support is disposed and a second area in which the support is not disposed are defined in an area in which each of the first and third layers does not overlap the second layer in a plan view of the display panel.

16. The display panel of claim 15, wherein
the second electrode is partially discontinuous due to the second area, and
the second electrode has a first end and a second end spaced apart from each other in the second area.

17. The display panel of claim 16, wherein the first end contacts the second side end in the second area.

18. The display panel of claim 15, wherein
the first area includes a plurality of first areas,
a plurality of supports are respectively disposed in the plurality of first areas, and
two adjacent supports of the plurality of supports are spaced apart from each other via the second area.

19. The display panel of claim 18, wherein distances between adjacent supports among the plurality of supports are different from each other.

20. The display panel of claim 15, wherein
the support is in contact with the insulating layer, and
the support and the insulating layer include a same material.

21. The display panel of claim 15, wherein
the support includes a bottom face in contact with the first layer and a top face in contact with the third layer, and
a shape of the bottom face and the top face is rectangular in a plan view.

* * * * *